(12) United States Patent
Fei

(10) Patent No.: US 11,181,664 B2
(45) Date of Patent: Nov. 23, 2021

(54) METHOD AND DEVICE FOR DETERMINING DESCRIPTIVE INFORMATION OF PRECIPITATION TREND, AND READABLE STORAGE MEDIUM

(71) Applicant: Beijing Xiaomi Mobile Software Co., Ltd., Beijing (CN)

(72) Inventor: Yue Fei, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 704 days.

(21) Appl. No.: 15/987,554

(22) Filed: May 23, 2018

(65) Prior Publication Data

US 2018/0341041 A1    Nov. 29, 2018

(30) Foreign Application Priority Data

May 25, 2017 (CN) .......................... 201710379655.8

(51) Int. Cl.
  *G06F 30/20*  (2020.01)
  *G01W 1/10*   (2006.01)
  *G01W 1/14*   (2006.01)

(52) U.S. Cl.
  CPC ............... *G01W 1/10* (2013.01); *G01W 1/14* (2013.01); *G06F 30/20* (2020.01); *G01W 2203/00* (2013.01); *Y02A 90/10* (2018.01)

(58) Field of Classification Search
  CPC ..... G01W 1/10; G01W 1/14; G01W 2203/00; G06F 30/20; Y02A 90/10; G05B 15/02; G06N 5/04; G06Q 10/04
  See application file for complete search history.

(56) References Cited

U.S. PATENT DOCUMENTS

| 5,898,110 A |   | 4/1999  | Hagstrom |
|---|---|---|---|
| 6,128,578 A | * | 10/2000 | Sakaino ................. G06T 7/246 702/3 |

(Continued)

FOREIGN PATENT DOCUMENTS

| CN | 101609172 B | * | 1/2011 |
|---|---|---|---|
| CN | 104380146 A |   | 2/2015 |

(Continued)

OTHER PUBLICATIONS

Combined Chinese Office Action and Search Report dated Jun. 16, 2020 in Chinese Patent Application No. 201710379655.8 (with English translation), 16 pages.

(Continued)

*Primary Examiner* — Kandasamy Thangavelu
(74) *Attorney, Agent, or Firm* — Oblon, McClelland, Maier & Neustadt, L.L.P.

(57) ABSTRACT

The disclosure relates to a method and device for determining descriptive information of a precipitation trend and a readable storage medium. The method includes acquiring precipitation data in a preset time period; acquiring precipitation intensities at a plurality of precipitation moments in the preset time period from the precipitation data, the plurality of precipitation moments being obtained by dividing the preset time period according to a preset strategy; selecting at least one critical precipitation moment from the plurality of precipitation moments based on the precipitation intensities at the plurality of precipitation moments, the at least one critical precipitation moment referring to a precipitation moment playing a critical role in the descriptive information of the precipitation trend in the preset time period; determining timeliness corresponding to the at least one critical precipitation moment; and determining the descriptive information of the precipitation trend in the preset time period based on the timeliness and a precipita- (Continued)

tion intensity corresponding to the at least one critical precipitation moment.

20 Claims, 13 Drawing Sheets

(56) References Cited

U.S. PATENT DOCUMENTS

2016/0014983 A1* 1/2016 Micu ...................... G05B 15/02
                                                        700/284
2016/0343093 A1* 11/2016 Riland ................... G06Q 10/04

FOREIGN PATENT DOCUMENTS

JP          4486004 B2 *    6/2010
JP          6126759 B1      5/2017
WO    WO 2015105277 A1 *    7/2015   ............... G06N 5/04
WO    WO 2016/039741 A1     3/2016

OTHER PUBLICATIONS

Extended European Search Report dated Oct. 15, 2018 in corresponding European Patent Application No. 18174178.6, 9 pages.
Ross Turner et al., "Selecting the Content of Textual Descriptions of Geographically Located Events in Spatio-Temporal Weather Data" In: "Applications and Innovations in Intelligent Systems XV", Jan. 1, 2008, XP055512920, 14 pages.
Eli Goldberg et al., "Using Natural-language Processing to Produce Weather Forecasts", IEEE Expert, Natural-language Processing, XP011422946, vol. 9, No. 2, Apr. 1, 1994, pp. 45-53.
Alejandro Ramos-Soto et al., "Linguistic Descriptions for Automatic Generation of Textual Short-Term Weather Forecasts on Real Prediction Data", IEEE Transactions on Fuzzy Systems, XP011571935, vol. 23, No. 1, Feb. 1, 2015, pp. 44-57.

* cited by examiner

201 — When precipitation data in a preset time period is acquired, precipitation intensities at multiple precipitation moments in the preset time period are acquired from the precipitation data, the multiple precipitation moments being obtained by dividing the preset time period according to a preset strategy 202 — A number of precipitation waves in the preset time period is determined on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period 203 — When the number of the precipitation waves is 1, at least one turning-up moment and at least one turning-down moment are determined in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases 204 — At least one critical precipitation moment is determined on the basis of the starting moment and ending moment of the precipitation wave, the at least one turning-up moment and the at least one turning-down moment 205 — Timeliness corresponding to the at least one critical precipitation moment is determined, and descriptive information of a precipitation trend in the preset time period is determined on the basis of the timeliness and precipitation intensity corresponding to the at least one critical precipitation moment

FIG. 2A

METHOD AND DEVICE FOR DETERMINING DESCRIPTIVE INFORMATION OF PRECIPITATION TREND, AND READABLE STORAGE MEDIUM

CROSS-REFERENCE TO RELATED APPLICATIONS

This application is based upon and claims priority to Chinese Patent Application No. 201710379655.8, filed on May 25, 2017, the entire contents of which are incorporated herein by reference.

TECHNICAL FIELD

The present disclosure generally relates to the technical field of information processing, and more particularly, to a method and device for determining descriptive information of a precipitation trend and a readable storage medium.

BACKGROUND

Weather forecasting is being developed constantly towards the direction of data detailing. Through an installed weather forecasting application, a terminal may acquire and display weather data such as a temperature, humidity and wind power. In related arts, however, trends of such data may not be delivered to a user in sufficient descriptive detail to provide for intuitive interpretation.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a method for determining descriptive information of a precipitation trend. The method includes acquiring precipitation data in a preset time period; acquiring precipitation intensities at a plurality of precipitation moments in the preset time period from the precipitation data, the plurality of precipitation moments being obtained by dividing the preset time period according to a preset strategy; selecting at least one critical precipitation moment from the plurality of precipitation moments based on the precipitation intensities at the plurality of precipitation moments, the at least one critical precipitation moment referring to a precipitation moment playing a critical role in the descriptive information of the precipitation trend in the preset time period; determining timeliness corresponding to the at least one critical precipitation moment; and determining the descriptive information of the precipitation trend in the preset time period based on the timeliness and a precipitation intensity corresponding to the at least one critical precipitation moment.

In an example, when selecting the at least one critical precipitation moment from the plurality of precipitation moments based on the precipitation intensities at the plurality of precipitation moments, the method includes determining a number of precipitation waves in the preset time period based on the precipitation intensities at the plurality of precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period; when the number of the precipitation waves is 1, determining at least one turning-up moment and at least one turning-down moment in the plurality of precipitation moments based on the precipitation intensities at the plurality of precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and determining the at least one critical precipitation moment based on the starting moment and the ending moment of the precipitation wave, the at least one turning-up moment, and the at least one turning-down moment.

In another example, when determining the at least one critical precipitation moment based on the starting moment and the ending moment of the precipitation wave, the at least one turning-up moment, and the at least one turning-down moment, the method includes determining a critical turning-up moment in the at least one turning-up moment; determining a critical turning-down moment in the at least one turning-down moment; when a precipitation intensity at a next precipitation moment adjacent to the critical turning-up moment is higher than a precipitation intensity at the starting moment of the preset time period and precipitation intensity levels of precipitation intensities in a preset continuous time duration after the critical turning-up moment do not change, determining the starting moment and the ending moment of the precipitation wave, the critical turning-up moment, the next precipitation moment adjacent to the critical turning-up moment, the critical turning-down moment, and a next precipitation moment adjacent to the critical turning-down moment to be the at least one critical precipitation moment; when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, determining the starting moment and the ending moment of the precipitation wave, the critical turning-down moment, and the next precipitation moment adjacent to the critical turning-down moment to be the at least one critical precipitation moment.

In yet another example, when determining the critical turning-up moment in the at least one turning-up moment, the method includes when there are turning-up moments of which the precipitation intensities are at different precipitation intensity levels in the at least one turning-up moment, determining a turning-up moment with the maximum precipitation intensity in the at least one turning-up moment to be the critical turning-up moment; and when the precipitation intensity at the at least one turning-up moment is at a same precipitation intensity level, determining an earliest turning-up moment to be the critical turning-up moment.

In yet another example, when determining the critical turning-down moment in the at least one turning-down moment, the method includes, when there are turning-down moments of which the precipitation intensities are at different precipitation intensity levels in the at least one turning-down moment, determining a turning-down moment with the minimum precipitation intensity in the at least one turning-down moment to be the critical turning-down moment; and when the precipitation intensity at the at least one turning-down moment is at a same precipitation intensity level, determining a turning-down moment closest to the ending moment of the preset time period to be the critical turning-down moment.

According to one aspect, the method includes, after determining the number of the precipitation waves in the preset time period based on the precipitation data, when the number of the precipitation waves is 2, selecting, from the plurality of precipitation moments, a starting moment and an ending moment of a first precipitation wave and a starting moment of a second precipitation wave in the preset time period; and determining the starting moment and the ending moment of the first precipitation wave and the starting moment of the second precipitation wave to be the at least one critical precipitation moment.

In an example, when determining the descriptive information of the precipitation trend in the preset time period based on the timeliness and the precipitation intensity corresponding to the at least one critical precipitation moment, the method includes determining a description manner corresponding to each critical precipitation moment of the at least one critical precipitation moment; and generating the descriptive information of the precipitation trend in the preset time period in the description manner corresponding to each critical precipitation moment according to a chronological order the at least one critical precipitation moment based on the timeliness and precipitation intensity corresponding to the at least one critical precipitation moment.

According to another aspect, the method includes, after determining the descriptive information of the precipitation trend in the preset time period based on the timeliness and the precipitation intensity corresponding to the at least one critical precipitation moment, determining travel prompting information corresponding to the precipitation trend in the preset time period based on timeliness and precipitation intensities corresponding to the plurality of precipitation moments.

Aspects of the disclosure also provide a device for determining descriptive information of a precipitation trend. The device includes a processor and a memory configured to store instructions executable by the processor. The processor is configured to acquire precipitation data in a preset time period; acquire precipitation intensities at a plurality of precipitation moments in the preset time period from the precipitation data, the plurality of precipitation moments being obtained by dividing the preset time period according to a preset strategy; select at least one critical precipitation moment from the plurality of precipitation moments based on the precipitation intensities at the plurality of precipitation moments, the at least one critical precipitation moment referring to a precipitation moment playing a critical role in the descriptive information of the precipitation trend in the preset time period; determine timeliness corresponding to the at least one critical precipitation moment; and determine the descriptive information of the precipitation trend in the preset time period based on the timeliness and a precipitation intensity corresponding to the at least one critical precipitation moment.

Aspects of the disclosure also provide a non-transitory computer-readable storage medium having stored therein instructions that, when executed by one or more processors of a computing device, cause the computing device to acquire precipitation data in a preset time period; acquire precipitation intensities at a plurality of precipitation moments in the preset time period from the precipitation data, the plurality of precipitation moments being obtained by dividing the preset time period according to a preset strategy; select at least one critical precipitation moment from the plurality of precipitation moments based on the precipitation intensities at the plurality of precipitation moments, the at least one critical precipitation moment referring to a precipitation moment playing a critical role in descriptive information of a precipitation trend in the preset time period; determine timeliness corresponding to the at least one critical precipitation moment; and determine the descriptive information of the precipitation trend in the preset time period based on the timeliness and a precipitation intensity corresponding to the at least one critical precipitation moment.

It is to be understood that both the foregoing general description and the following detailed description are illustrative and explanatory only and are not restrictive of the present disclosure.

BRIEF DESCRIPTION OF THE DRAWINGS

The accompanying drawings, which are incorporated in and constitute a part of this specification, illustrate aspects consistent with the present disclosure and, together with the description, serve to explain the principles of the present disclosure.

FIG. 2A is a flow chart showing a method for determining descriptive information of a precipitation trend, according to an exemplary aspect of the present disclosure.

Figure 1A:
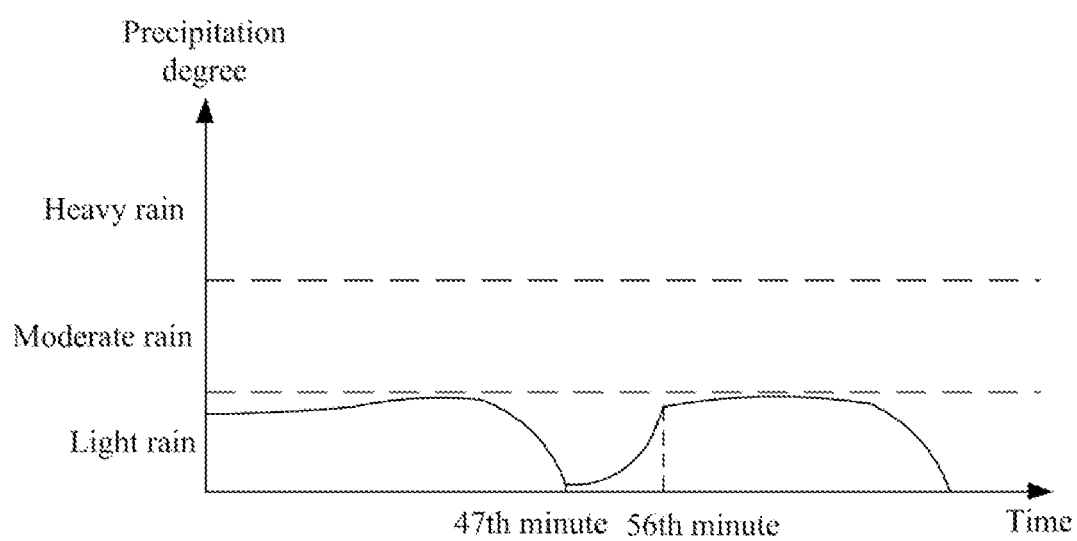
FIG. 1A is a curve diagram of precipitation data, according to an aspect of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

Reference will now be made in detail to illustrative exemplary aspects, examples of which are illustrated in the accompanying drawings. The following description refers to the accompanying drawings in which the same numbers in different drawings represent the same or similar elements unless otherwise represented. The implementations set forth in the following description of illustrative aspects do not represent all implementations consistent with the disclosure. Instead, they are merely examples of apparatuses and methods consistent with aspects related to the disclosure as recited in the appended claims.

Before the aspects of the present disclosure are explained and described in detail, an application scenario of the aspects of the present disclosure will be introduced at first. In recent years, a manner for acquiring weather data by people has not been limited to television broadcasting, and an application may directly be installed on a terminal for acquisition. Along with development of the field of weather forecasting to the direction of data detailing, through an installed application, a terminal may not only acquire data such as a temperature, humidity and wind power of every day, but also acquire accurate weather changes in a short time, such as precipitation data and wind power data in a short time (e.g., two hours). In general, after acquiring precipitation data in a short time, the terminal may not directly display the precipitation data, but may describe a precipitation trend corresponding to the precipitation data with a natural language according to a certain strategy and a copywriting rule. That is, the terminal may determine descriptive information of the corresponding precipitation trend according to the certain strategy and according to the precipitation data to enable a user to learn about precipitation changes in the future more intuitively. A method provided by the aspects of the present disclosure for determining descriptive information of a precipitation trend may be applied to such a scenario, and after acquiring precipitation data in a preset time period, the terminal may determine descriptive information of a precipitation trend in the preset time period by adopting the method provided by the aspects of the present disclosure for determining the descriptive information of the precipitation trend, thereby assisting the user in interpreting the precipitation data more intuitively.

When a precipitation trend corresponding to precipitation data is described, a terminal usually adopts an exhaustion method, that is, various precipitation trends corresponding to acquired precipitation data in a preset time period are described one by one. Even though change processes from no precipitation to precipitation frequently appear in the preset time period, the terminal may preferably describe the earlier precipitation trends according to a chronological order, and the latter precipitation trends may be subsequently described. That is, the terminal describes the precipitation trends corresponding to the precipitation data without considering importance, and all precipitation changes are always described according to the chronological order. Thus it can be seen that some methods for determining descriptive information of a precipitation trend in the related technology do not form any rule to follow, and thus are relatively poor in extensibility.

In order to solve the technical problem, the aspects of the present disclosure provide a method for determining descriptive information of a precipitation trend. The method for determining the descriptive information of the precipitation trend will now be explained and described in detail through the following aspects in combination with the accompanying drawings.

FIG. 1A is a curve diagram of precipitation data, according to an aspect of the present disclosure. When precipitation data in a short time is acquired, if there exist multiple segments of precipitation trends in this time period, the terminal may determine descriptive information corresponding to each precipitation trend included in the precipitation data by adopting an exhaustion method. The terminal may also determine the descriptive information of the earlier precipitation trends. For example, as shown in FIG. 1A, the terminal may acquire precipitation data in the next two hours, wherein a precipitation intensity will be reduced at the 47th minute, the precipitation intensity will start to be increased after 56 minutes, and the precipitation intensity will be reduced again after one hour and a half. For such precipitation changes, the terminal may determine descriptive information of the earlier precipitation trends, that is, the descriptive information determined by the terminal is that it will gradually stop raining after 47 minutes but will rain heavily again after 56 minutes.

Figure 1B:
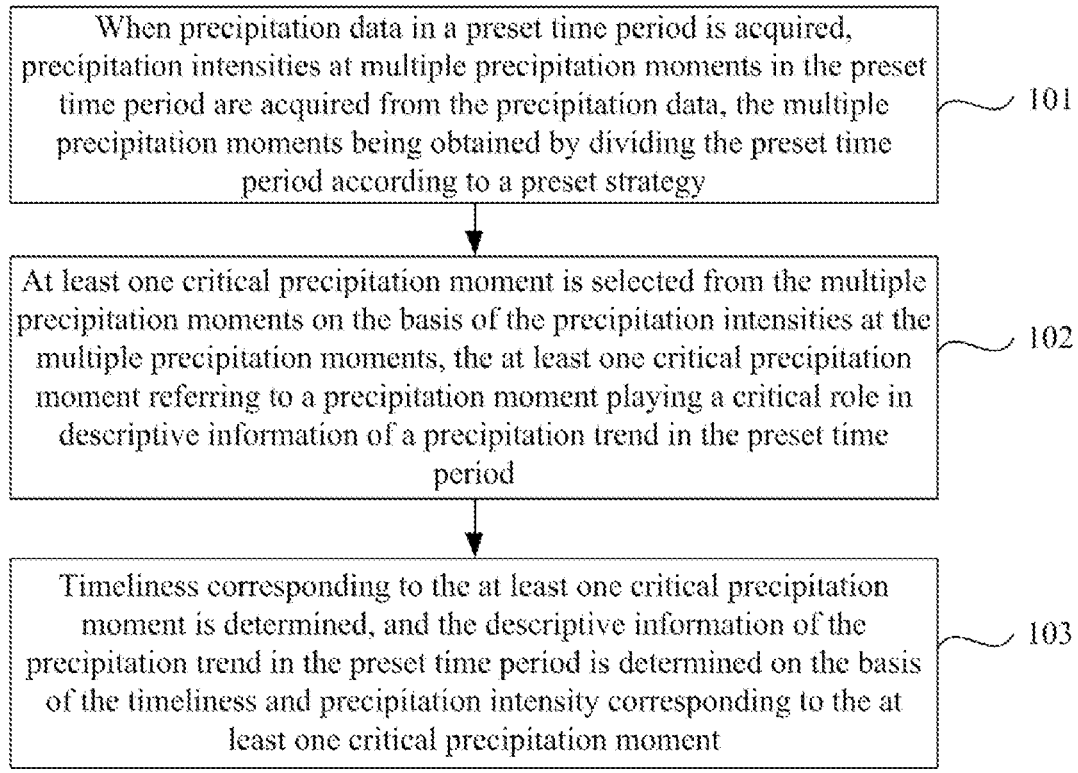
FIG. 1B is a flow chart showing a method for determining descriptive information of a precipitation trend, according to an exemplary aspect of the present disclosure.

FIG. 1B is a flow chart showing a method for determining descriptive information of a precipitation trend, according to an exemplary aspect. As shown in FIG. 1B, the method may be applied to a terminal, may also be applied to an application server corresponding to an installed weather forecasting application, and includes the following steps.

In Step 101, when precipitation data in a preset time period is acquired, precipitation intensities at multiple precipitation moments in the preset time period are acquired from the precipitation data, the multiple precipitation moments being obtained by dividing the preset time period according to a preset strategy.

In Step 102, at least one critical precipitation moment is selected from the multiple precipitation moments on the basis of the precipitation intensities at the multiple precipitation moments, the at least one critical precipitation moment referring to a precipitation moment playing a critical role in descriptive information of a precipitation trend in the preset time period.

In Step 103, timeliness corresponding to the at least one critical precipitation moment is determined, and the descriptive information of the precipitation trend in the preset time period is determined on the basis of the timeliness and precipitation intensity corresponding to the at least one critical precipitation moment.

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing the critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

Optionally, the operation that the at least one critical precipitation moment is selected from the multiple precipitation moments on the basis of the precipitation intensities at the multiple precipitation moments includes that:

a number of precipitation waves in the preset time period is determined on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;

when the number of the precipitation waves is 1, at least one turning-up moment and at least one turning-down moment are determined in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and the at least one critical precipitation moment is determined on the basis of the starting moment and ending moment of the precipitation wave, the at least one turning-up moment and the at least one turning-down moment.

Optionally, the operation that the at least one critical precipitation moment is determined on the basis of the starting moment and ending moment of the precipitation wave, the at least one turning-up moment and the at least one turning-down moment includes that:

a critical turning-up moment is determined in the at least one turning-up moment, and a critical turning-down moment is determined in the at least one turning-down moment;

when the precipitation intensity at the next precipitation moment adjacent to the critical turning-up moment is higher than a precipitation intensity at the starting moment of the preset time period and precipitation intensity levels of the precipitation intensities in a preset continuous time duration after the critical turning-up moment do not change, the starting moment and ending moment of the precipitation wave, the critical turning-up moment, the next precipitation moment adjacent to the critical turning-up moment, the critical turning-down moment and the next precipitation moment adjacent to the critical turning-down moment are determined to be the at least one critical precipitation moment; and when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, the starting moment and ending moment of the precipitation wave, the critical turning-down moment and the next precipitation moment adjacent to the critical turning-down moment are determined to be the at least one critical precipitation moment.

Optionally, the operation that the critical turning-up moment is determined in the at least one turning-up moment includes that:

when there are turning-up moments of which the precipitation intensities are at different precipitation intensity levels in the at least one turning-up moment, a turning-up moment with the maximum precipitation intensity in the at least one turning-up moment is determined to be the critical turning-up moment; and when the precipitation intensity at the at least one turning-up moment is at a same precipitation intensity level, an earliest turning-up moment is determined to be the critical turning-up moment.

Optionally, the operation that the critical turning-down moment is determined in the at least one turning-down moment includes that:

when there are turning-down moments of which the precipitation intensities are at different precipitation intensity levels in the at least one turning-down moment, a turning-down moment with the minimum precipitation intensity in the at least one turning-down moment is determined to be the critical turning-down moment; and when the precipitation intensity at the at least one turning-down moment is at a same precipitation intensity level, a turning-down moment closest to the ending moment of the preset time period is determined to be the critical turning-down moment.

Optionally, after the operation that the number of the precipitation waves in the preset time period is determined on the basis of the precipitation data, the method further includes that:

when the number of the precipitation waves is 2, a starting moment and an ending moment of a first precipitation wave and a starting moment of a second precipitation wave in the preset time period are selected from the multiple precipitation moments; and the starting moment and ending moment of the first precipitation wave and the starting moment of the second precipitation wave are determined to be the at least one critical precipitation moment.

Optionally, the operation that the descriptive information of the precipitation trend in the preset time period is determined on the basis of the timeliness and precipitation intensity corresponding to the at least one critical precipitation moment includes that:

a description manner corresponding to each critical precipitation moment of the at least one critical precipitation moment is determined; and the descriptive information of the precipitation trend in the preset time period is generated in the description manner corresponding to each critical precipitation moment according to a chronological order the at least one critical precipitation moment on the basis of the timeliness and precipitation intensity corresponding to the at least one critical precipitation moment.

Optionally, after the operation that the descriptive information of the precipitation trend in the preset time period is determined on the basis of the timeliness and precipitation intensity corresponding to the at least one critical precipitation moment, the method further includes that:

travel prompting information corresponding to the precipitation trend in the preset time period is determined on the basis of timeliness and precipitation intensities corresponding to the multiple precipitation moments.

All of the optional technical solutions may be freely combined to form optional aspects of the present disclosure, which will not be elaborated one by one in the aspect of the present disclosure.

In the aspects of the present disclosure, according to different numbers of the precipitation waves existing in the preset time period, the at least one critical precipitation moment selected from the preset time period by the terminal is also different, and methods for determining descriptive information according to the at least one critical moment are also different. Therefore, the methods for determining the descriptive information of the precipitation trend in case of different numbers of the precipitation waves will be explained and described in the aspects of the present disclosure respectively. At first, the aspects of the present disclosure will introduce the method for determining the descriptive information of the precipitation trend when the number of the precipitation waves is 1 through the following aspect in combination with FIG. 2.

FIG. 2 is a flow chart showing a method for determining descriptive information of a precipitation trend, according to an exemplary aspect. The method may be applied to a terminal, and may also be applied to an application server corresponding to a weather forecasting application installed in the terminal. Explanations and descriptions will be made with the terminal as an example in the aspect of the present disclosure. As shown in FIG. 2, the method includes the following steps.

In Step 201, when precipitation data in a preset time period is acquired, precipitation intensities at multiple precipitation moments in the preset time period are acquired from the precipitation data, the multiple precipitation moments being obtained by dividing the preset time period according to a preset strategy.

The method provided by the aspect of the present disclosure for determining the descriptive information of the precipitation trend is mainly applied to description about a precipitation trend corresponding to precipitation data in a relatively short preset time period, that is, the method is mainly applied to determination of descriptive information when an accurate precipitation change in a short time is forecast, wherein the relatively short preset time period may be shorter than 24 hours, for example, the preset time period may be 1 hour, 2 hours, 3 hours or the like.

In general, the precipitation data acquired by the terminal may be a precipitation intensity of each minute. Of course, the precipitation data acquired by the terminal may also be a precipitation intensity of another time unit, a magnitude of the time unit may change according to a length of the preset time period, the time unit may also be smaller if the preset time period is shorter, and correspondingly, the time unit may also be larger if the preset time period is longer.

Wherein, the precipitation intensity is a unit-free numerical value between [0,1], moreover, the terminal may divide a precipitation intensity range of [0,1] to obtain multiple precipitation intensity levels, and each precipitation intensity level may correspond to a precipitation degree. For example, (0,0.03) may be the first precipitation intensity level, and the precipitation degree corresponding to the first precipitation intensity level is no rain or no snow, that is, when the precipitation intensity is in this range, it is indicated that it does not rain or snow; [0.03,0.25) is the second precipitation intensity level, and the precipitation degree corresponding to the second precipitation intensity level is light rain or light snow; [0.25,0.35) is the third precipitation intensity level, and the precipitation degree corresponding to the third precipitation intensity level is moderate rain or moderate snow; and [0.35,1) is the fourth precipitation intensity level, and the precipitation degree corresponding to the fourth precipitation intensity level is heavy rain or heavy snow. The above is only an exemplary precipitation intensity level division method provided by the aspect of the present disclosure and not intended to specifically limit precipitation intensity level division. In addition, in the aspect of the present disclosure, whether the acquired precipitation data corresponds to precipitation or snowing may be determined according to a mean temperature in the preset time period, it is precipitation when the mean temperature is higher than 0 degree centigrade, and it is snowing when the mean temperature is lower than or equal to 0 degree centigrade. Subsequent descriptions will be made in the aspect of the present disclosure with precipitation as an example.

After all the precipitation data in the preset time period is acquired, the terminal may divide the preset time period according to a specified time duration, thereby obtaining multiple precipitation moments in the preset time period, wherein the specified time duration is required to be an integral multiple of the time unit. For example, if the preset time period is 120 minutes and the acquired precipitation data is the precipitation intensity of each minute, the terminal may divide the 120 minutes by 2 minutes, and precipitation moments are obtained every two minutes, so that 60 precipitation moments in the preset time period are obtained. Of course, for ensuring accuracy of the descriptive information, the terminal may not divide the precipitation data in the preset time period, but directly acquires a precipitation moment corresponding to each piece of precipitation data, thereby obtaining multiple precipitation moments. Under such a condition, when the preset time period is 120 minutes and the acquired precipitation data is the precipitation intensity of each minute, the terminal may determine that 120 precipitation moments in the preset time period are obtained.

After the precipitation intensities at the multiple precipitation moments in the precipitation data are acquired, the terminal may select at least one critical precipitation moment from the multiple precipitation moments on the basis of the precipitation intensities at the multiple precipitation moments by virtue of a method in Step 202-Step 204.

In Step 202, a number of precipitation waves in the preset time period is determined on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period.

After determining that the multiple precipitation moments are obtained, the terminal may divide the precipitation data in the preset time period into at least one precipitation wave on the basis of the precipitation intensities at the multiple precipitation moments.

Wherein, if there exist two precipitation moments with precipitation intensities 0 in the preset time period and the precipitation intensities at all the precipitation moments between the two precipitation moments are higher than 0, the precipitation intensities at the two precipitation moments and the precipitation intensities at all the precipitation moments between the two precipitation moments may form a precipitation wave.

If the precipitation intensities in the preset time period are all higher than 0, the number of the precipitation waves in the preset time period is 1, the starting moment of the precipitation wave is the starting moment of the preset time period, and the ending moment of the precipitation wave is the ending moment of the preset time period.

Or, if a precipitation intensity at the starting moment of the preset time period is higher than 0, the precipitation intensities at all the precipitation moments between the starting moment and the closest precipitation moment with the precipitation intensity 0 may also form a precipitation wave, a starting moment of the precipitation wave is the starting moment of the preset time period, and an ending moment of the precipitation wave is the precipitation moment closest to the starting moment of the preset time period and with the precipitation intensity 0.

Or, if a precipitation intensity at the ending moment of the preset time period is not 0, the precipitation intensities from the precipitation moment closest to the ending moment and with the precipitation intensity 0 to the ending moment of the preset time period may also form a precipitation wave, a starting moment of the precipitation wave is the precipitation moment closest to the ending moment of the preset time period and with the precipitation intensity 0, and an ending moment of the precipitation wave is the ending moment of the preset time period.

After the terminal determines the number of the precipitation waves in the preset time period in such a manner, when the number of the precipitation waves is 1, the descriptive information of the precipitation trend in the preset time period may be determined through the next steps in the aspect.

In Step 203, when the number of the precipitation waves is 1, at least one turning-up moment and at least one turning-down moment are determined in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases.

When determining that the number of the precipitation waves in the preset time period is 1, the terminal may determine the at least one turning-up moment and the at least one turning-down moment in the multiple precipitation moments in the preset time period.

Wherein, for each turning-up moment in the at least one turning-up moment, the turning-up moment refers to the moment at which the turning point of the corresponding precipitation intensity level occurs in an increase process of the precipitation intensity, that is, the precipitation intensities at the previous and next moments adjacent to the turning-up moment are at different precipitation intensity levels, and the precipitation intensity at the next moment adjacent to the turning-up moment is higher than the precipitation intensity at the previous moment adjacent to the turning-up moment.

Similarly, for each turning-down moment in the at least one turning-up moment, the turning-down moment refers to the moment at which the turning point of the corresponding precipitation intensity level occurs in a decrease process of the precipitation intensity, that is, the precipitation intensities at the previous and next moments adjacent to the turning-down moment are at different precipitation intensity levels, and the precipitation intensity at the next moment adjacent to the turning-down moment is lower than the precipitation intensity at the previous moment adjacent to the turning-down moment.

Furthermore, there may not exist the turning-up moment and the turning-down moment in the preset time period. For example, it starts raining from the starting moment of the preset time period and will last till the ending moment of the preset time period, and the precipitation intensities in the preset time period are at a same precipitation intensity level. Under such a condition, the terminal may not execute the step.

In Step 204, at least one critical precipitation moment is determined on the basis of the starting moment and ending moment of the precipitation wave, the at least one turning-up moment and the at least one turning-down moment.

After determining the at least one turning-up moment and at least one turning-down moment of the precipitation wave, the terminal may determine the at least one critical precipitation moment through the following steps.

(1) A critical turning-up moment is determined in the at least one turning-up moment, and a critical turning-down moment is determined in the at least one turning-down moment.

Wherein, when there are turning-up moments of which the precipitation intensities are at different precipitation intensity levels in the at least one turning-up moment, a turning-up moment with the maximum precipitation intensity in the at least one turning-up moment is determined to be the critical turning-up moment; and when the precipitation intensity at the at least one turning-up moment is at a same precipitation intensity level, an earliest turning-up moment is determined to be the critical turning-up moment.

Similarly, when there are turning-down moments of which the precipitation intensities are at different precipitation intensity levels in the at least one turning-down moment, a turning-down moment with the minimum precipitation intensity in the at least one turning-down moment is determined to be the critical turning-down moment; and when the precipitation intensity at the at least one turning-down moment is at a same precipitation intensity level, a turning-down moment closest to the ending moment of the preset time period is determined to be the critical turning-down moment.

In general, there may exist multiple turning-up moments in a precipitation wave. Since the same descriptive information is used when precipitation intensities at a same precipitation intensity level are described, for example, descriptive information corresponding to the precipitation intensities at the second precipitation intensity level is light rain or light snow, when precipitation intensities at the multiple turning-up moments are at a same precipitation intensity level, no matter which turning-up moment is selected to be the critical turning-up moment, corresponding maximum precipitation in the preset time period may be reflected. Under such a condition, considering that precipitation forecasting is not allowed to be delayed during a practical application, the terminal may determine the earliest turning-up moment in the at least one turning-up moment to be the critical turning-up moment. Similarly, when precipitation intensities at multiple turning-down moments are at a same precipitation intensity level, considering that the last turning-down moment is more referentially significant for a user on the aspect of forecasting about when it stops raining or snowing when precipitation is forecast during the practical application, the terminal may determine the turning-down moment closest to the ending moment of the preset time period in the at least one turning-down moment to be the critical turning-down moment.

(2) When the precipitation intensity at the next precipitation moment adjacent to the critical turning-up moment is higher than the precipitation intensity at the starting moment of the preset time period and precipitation intensity levels of the precipitation intensities in a preset continuous time duration after the critical turning-up moment do not change, the starting moment and ending moment of the precipitation wave, the critical turning-up moment, the next precipitation moment adjacent to the critical turning-up moment, the critical turning-down moment and the next precipitation moment adjacent to the critical turning-down moment are determined to be the at least one critical precipitation moment.

After the critical turning-up moment is determined, if the precipitation intensity at the next precipitation moment adjacent to the critical turning-up moment is higher than the precipitation intensity at the starting moment of the preset time period, it may be considered that the critical turning-up moment is a representative precipitation moment in the preset time period. Meanwhile, if the precipitation intensity levels of the precipitation intensities in the preset continuous time duration after the critical turning-up moment do not change, it is indicated that a precipitation intensity level of the next precipitation moment adjacent to the critical turning-up moment is kept for a certain time duration, that is, the critical turning-up moment does not belong to data under the condition that the precipitation trend frequently changes or does not belong to sudden change data. Under such a condition, the terminal may determine the starting moment and ending moment of the precipitation wave, the critical turning-up moment, the next precipitation moment adjacent to the critical turning-up moment, the critical turning-down moment and the next precipitation moment adjacent to the critical turning-down moment to be the at least one critical precipitation moment.

Wherein, the preset continuous time duration may be 10 minutes, 15 minutes or another numerical value. For example, if the preset continuous time duration is 10 minutes, when the precipitation intensity at the next precipitation moment adjacent to the critical turning-up moment is higher than the precipitation intensity at the starting moment of the preset time period and precipitation intensity levels of precipitation intensities in 10 minutes after the critical turning-up moment do not change, it may be indicated that the precipitation intensity level of the precipitation intensity at the next precipitation moment adjacent to the critical turning-up moment is kept for at least 10 minutes. Under such a condition, it may be determined that both the precipitation intensities at the critical turning-up moment and the next precipitation moment adjacent to the critical turning-up moment are not sudden change data or the precipitation trend of this segment is not a frequently changing precipitation trend and is a precipitation trend which may greatly influence travel of the user in the preset time period. Therefore, the terminal is required to determine the critical turning-up moment to be one of the at least one critical precipitation moment.

(3) When the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, the starting moment and ending moment of the precipitation wave, the critical turning-down moment and the next precipitation moment adjacent to the critical turning-down moment are determined to be the at least one critical precipitation moment.

Based on the descriptions in (2), after the critical turning-up moment is determined, if the precipitation intensity at the next precipitation moment adjacent to the critical turning-up moment is lower than or equal to the precipitation intensity at the starting moment of the preset time period, it is indicated that the precipitation trend in the preset time period does not relatively obviously rise, at this moment, the critical turning-up moment is no longer the critical representative precipitation moment in the preset time period, and when the descriptive information of the precipitation trend is determined, describing or not describing the critical turning-up moment is referentially insignificant for the user. Therefore, when determining the at least one critical precipitation moment, the terminal may directly abandon the critical turning-up moment and only determine the starting moment and ending moment of the precipitation wave, the critical turning-down moment and the next precipitation moment adjacent to the critical turning-down moment to be the at least one critical precipitation moment.

Optionally, the terminal may also determine whether to determine the critical turning-down moment to be one of the at least one critical precipitation moment or not with reference to the methods in Step (2) and Step (3). If the terminal rejects both the critical turning-up moment and the critical turning-down moment from the at least one critical precipitation moment according to the methods in Steps (2) and (3), the terminal may determine the starting moment of the preset time period to be the at least one critical precipitation moment.

Furthermore, when there does not exist the at least one turning-up moment and the at least one turning-down moment in the preset time period, the terminal may also directly determine the starting moment of the preset time period to be the at least one critical precipitation moment.

In Step 205, timeliness corresponding to the at least one critical precipitation moment is determined, and descriptive information of a precipitation trend in the preset time period is determined on the basis of the timeliness and precipitation intensity corresponding to the at least one critical precipitation moment.

After the at least one critical precipitation moment is determined, the timeliness corresponding to the at least one critical precipitation moment may be determined. Then, the terminal may determine a description manner corresponding to each critical precipitation moment of the at least one critical precipitation moment, and generate the descriptive information of the precipitation trend in the preset time period in the description manner corresponding to each critical precipitation moment according to a chronological order the at least one critical precipitation moment on the basis of the timeliness and precipitation intensity corresponding to the at least one critical precipitation moment.

Wherein, the terminal may divide the preset time period into multiple time buckets, each time bucket may correspond to timeliness, and timeliness corresponding to the precipitation moments in the time bucket are the timeliness corresponding to the time bucket. For example, if the preset time period is 120 minutes, the terminal may determine [0,10] to be a first time bucket, and timeliness corresponding to the first time bucket is "at once", that is, the timeliness corresponding to all the precipitation moments in the first time bucket are "at once"; (10,30] is determined to be a second time bucket, and timeliness corresponding to the second time bucket is "in half an hour"; (30,60] is determined to be a third time bucket, and timeliness corresponding to the third time bucket is "half an hour later"; (60,90] is determined to be a fourth time bucket, and timeliness corresponding to the fourth time bucket is "an hour later"; and (90,120] is determined to be a fifth time bucket, and timeliness corresponding to the fifth time bucket is "in two hours". The above is only an exemplary manner provided by the aspect of the present disclosure for dividing the preset time period into the time buckets and determining the corresponding time degree for each time bucket and not intended to specifically limit a division manner and timeliness determination manner.

Based on the above descriptions, for each critical precipitation moment of the at least one critical precipitation moment, the terminal may determine the specific time bucket where the critical precipitation moment is located, and then the terminal may determine the timeliness corresponding to the time bucket to be the timeliness of the critical precipitation moment. Moreover, based on the descriptions in Step 201, the terminal may determine the specific precipitation intensity level of the precipitation intensity at the critical precipitation moment, and determine the precipitation degree corresponding to the determined precipitation intensity level to be a precipitation degree of the critical precipitation moment.

It is also important to note that, from the descriptions in Step 204, it can be seen that the at least one critical precipitation moment is of a fixed type, that is, the at least one critical precipitation moment must be the starting moment or ending moment of the precipitation wave, the critical turning-up moment or the critical turning-down moment. Therefore, for each critical precipitation moment, the terminal may determine the description manner corresponding to the critical precipitation moment.

If the critical precipitation moment is the critical turning-up moment, the description manner corresponding to the critical precipitation moment may be <the timeliness corresponding to the critical turning-up moment>+"to"+<the precipitation degree of the next moment adjacent to the critical turning-up moment>.

If the critical precipitation moment is the critical turning-down moment, the description manner corresponding to the critical precipitation moment may be <the timeliness corresponding to the critical turning-down moment>+"to"+<the precipitation degree of the next moment adjacent to the critical turning-down moment>.

If the critical precipitation moment is the starting moment of the precipitation wave and the precipitation intensity at the starting moment of the precipitation wave is not 0, that is, the starting moment of the precipitation wave is the starting moment of the preset time period, at this moment, the description manner corresponding to the critical precipitation moment may be "it is raining"+<the precipitation degree of the starting moment of the preset time period>.

If the critical precipitation moment is the starting moment of the precipitation wave and the starting moment of the precipitation wave is not the starting moment of the preset time period, at this moment, the description manner corresponding to the critical precipitation moment may be <the precipitation degree corresponding to the starting moment of the precipitation wave>+"it will rain".

If the critical precipitation moment is the ending moment of the precipitation wave and the ending moment of the precipitation wave is not the ending moment of the preset time period, at this moment, the description manner corresponding to the critical precipitation moment may be <the timeliness corresponding to the ending moment of the precipitation wave>+"it will gradually stop raining".

Optionally, when two adjacent critical precipitation moments correspond to the same time degree, the timeliness in the description manner corresponding to the latter critical precipitation moment may be changed into "then'.

Optionally, if the chronological order of the at least one critical precipitation moment of the precipitation wave is the starting moment of the precipitation wave, the critical turning-up moment, the critical turning-down moment and the ending moment of the precipitation wave, when the starting moment of the precipitation wave, the critical turning-up moment and the critical turning-down moment correspond to the same time degree, the description manners of the three critical precipitation moments are combined into <the timeliness corresponding to the precipitation moment of the precipitation wave>+"it will rain"+<the precipitation degree corresponding to the precipitation intensity at the critical turning-up moment>+"then to"+<the precipitation degree corresponding to the precipitation intensity at the critical fall precipitation moment>.

Optionally, if the chronological order of the at least one critical precipitation moment of the precipitation wave is the starting moment of the precipitation wave, the critical turning-up moment, the critical turning-down moment and the ending moment of the precipitation wave, when the critical turning-up moment, the critical turning-down moment and the ending moment of the precipitation wave correspond to the same time degree, the description manner of the critical turning-down moment is eliminated to obtain a description manner of the three critical precipitation moments, which is <the timeliness corresponding to the critical turning-up moment>+"to" <the precipitation degree corresponding to the precipitation intensity at the next moment adjacent to the critical turning-up moment>+"then it will gradually stop raining".

Optionally, if the chronological order of the at least one critical precipitation moment of the precipitation wave is the starting moment of the precipitation wave, the critical turning-up moment, the critical turning-down moment and the ending moment of the precipitation wave, when the four critical precipitation moments correspond to the same time degree, the description manners of the four critical precipitation moments are combined into "the timeliness corresponding to the starting moment of the precipitation wave"+"it will rain"+<the precipitation degree corresponding to the precipitation intensity at the critical turning-up moment>+"then it will gradually stop raining".

After the description manner corresponding to the at least one critical precipitation moment is determined, the terminal may connect the corresponding description manner in series according to a chronological order of the at least one critical precipitation moment, and then the terminal may fill a corresponding position of the description manner with the timeliness and precipitation degree corresponding to the at least one critical precipitation moment, thereby obtaining the descriptive information of the precipitation trend in the preset time period. Of course, the terminal may also fill the corresponding description manner with the timeliness and precipitation degree corresponding to the at least one critical precipitation moment to obtain the descriptive information corresponding to each critical precipitation moment and then connect multiple pieces of descriptive information in series according to the chronological order of the at least one precipitation moment to obtain the descriptive information of the precipitation trend in the preset time period.

Optionally, for the condition, described in Step 203 and Step 204, that there does not exist the critical turning-up moment and the critical turning-down moment in the preset time period, the terminal may directly determine the descriptive information of the precipitation trend in the preset time period according to the precipitation intensities at the multiple precipitation moments in the preset time period, wherein, if the precipitation intensities at the multiple precipitation moments in the preset time period belong to the first precipitation intensity level, the terminal may determine the descriptive information of the precipitation trend in the preset time period to be "it is spotting with rain". Otherwise the terminal may determine the descriptive information of the precipitation trend in the preset time period to be "in a future preset time period"+<the precipitation degree corresponding to the precipitation intensity at the starting moment of the precipitation wave>.

Optionally, for the condition, described in Step 204, that there exists the critical turning-up moment and the critical turning-down moment in the preset time period but both the critical turning-up moment and the critical turning-down moment are rejected and do not belong to critical precipitation moments, the terminal may determine the descriptive information in the preset time period according to the starting moment of the precipitation wave, wherein, when the precipitation intensity at the starting moment of the precipitation wave is 0, the terminal may determine the descriptive information of the precipitation in the preset time period to be <the timeliness corresponding to the starting moment of the precipitation wave>+"then it will keep raining". When the precipitation intensity at the starting moment of the precipitation wave is not 0, the terminal may determine the descriptive information of the precipitation trend in the preset time period to be "it will keep raining in a future preset time period".

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing a critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

In addition, in the aspect of the present disclosure, when the number of the precipitation waves in the preset time period is 1, the critical turning-up moment and the critical turning-down moment are selected from the turning-up moments and the turning-down moments, and the critical precipitation moment is determined according to the starting moment and ending moment of the precipitation wave, the critical turning-up moment and the critical turning-down moment. In such a manner, some sudden change data or precipitation data of frequently changing precipitation intensities in the preset time period may be screened, the terminal may put greater emphasis on description of some long-lasting precipitation trends with great influence on the user, and greater referential significance for guiding travel of the user is achieved.

Figure 2B:
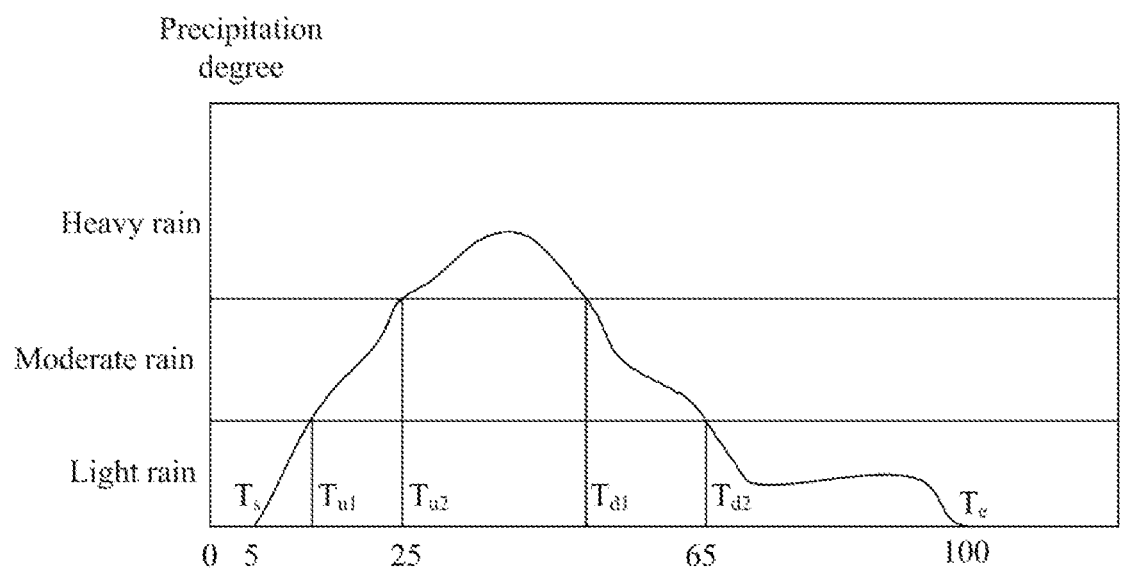
FIG. 2B is a curve diagram of precipitation data, according to an exemplary aspect of the present disclosure.

The steps in the method shown in FIG. 2A will be described below with a specific example. Here, there is made such a hypothesis that the preset time period is 2 hours, and the preset time period is divided into 120 precipitation moments in the 2 hours according to every minute. In addition, time bucket division is performed on the 2 hours. For example, in the example made in Step 205, the 2 hours are divided into 5 time buckets. Division of the precipitation degrees corresponding to the precipitation intensities is shown in the example in Step 205. The precipitation data in the 2 hours is drawn into a precipitation curve, as shown in FIG. 2B.

At first, according to the precipitation data shown in FIG. 2, the terminal may determine that there exists only one precipitation wave in the preset time period, wherein $T_s$ is a starting moment of the precipitation wave, and $T_e$ is an ending moment of the precipitation wave. There exist two turning-up moments $T_{u1}$ and $T_{u2}$ and two turning-down moments $T_{d1}$ and $T_{d2}$ in the preset time period, wherein precipitation intensities at next precipitation moments $T_{u1+1}$ and $T_{u2+1}$ adjacent to the two turning-up moments respectively are both higher than $T_s$, and precipitation intensity levels of precipitation intensities corresponding to $T_{u1}$ and $T_{u2}$ are also different. Precipitation intensity levels of precipitation intensities corresponding to the two turning-down moments $T_{d1}$ and $T_{d2}$ are also different. At this moment, $T_{u2}$ with the maximum precipitation intensities in the turning-up moments may be determined to be a critical turning-up moment, and $T_{d2}$ with the minimum precipitation intensity in the turning-down moments is determined to be a critical turning-down moment. Then, the terminal may determine the starting moment $T_s$ and ending moment $T_e$ of the precipitation wave, the critical turning-up moment $T_{u2}$, the next precipitation moment $T_{u2+1}$ adjacent to the critical turning-up moment $T_{u2}$, the critical turning-down moment $T_{d2}$ and a next precipitation moment $T_{d2+1}$ adjacent to the critical turning-down moment to be critical precipitation moments.

After the critical precipitation moments are determined, the terminal may determine timeliness corresponding to at least one critical precipitation moment, wherein the starting moment of the precipitation wave is located at a 5th minute of the preset time period, so that the corresponding time degree is at once; the ending moment of the precipitation wave is located at a 100th minute of the preset time period, so that the corresponding time degree is in two hours; the critical turning-up moment is located at a 25th minute of the preset time period, so that the corresponding time degree is in half an hour; and the critical turning-down moment is located at a 65th minute of the preset time period, so that the corresponding time degree is an hour later. After the timeliness are determined, the terminal may determine a corresponding precipitation degree according to the precipitation intensity at the at least one critical precipitation moment, wherein the precipitation intensity at the next precipitation moment adjacent to the critical turning-up moment $T_{u2}$ is 0.4, and belongs to a fourth precipitation intensity level range, and the corresponding precipitation degree is heavy rain; and the precipitation intensity at the next precipitation moment adjacent to the critical turning-down moment is 0.1, and belongs to a second precipitation intensity level range, and the corresponding precipitation degree is light rain.

After the timeliness and precipitation degree of the at least one critical moment are determined, the terminal may determine a description manner corresponding to each critical precipitation moment of the at least one critical moment, wherein the description manners corresponding to different critical moments have been enumerated in Step 205 in detail, and will not be elaborated herein.

Then, the terminal may connect the determined description manners according to a chronological order to obtain a general description manner of the precipitation trend of the preset time period: <the timeliness corresponding to $T_s$>+"it will rain"+<the timeliness corresponding to $T_{u2}$>+"to" <the timeliness corresponding to $T_{u2+1}$>+<the timeliness corresponding to $T_{d2}$>+"to"+<the precipitation degree corresponding to $T_{d2+1}$>+<the timeliness corresponding to $T_e$>+ "it will gradually stop raining". After the general description manner is adopted, the terminal may fill corresponding positions of the description manners with the determined timeliness and precipitation degree, thereby obtaining descriptive information of the precipitation trend in the preset time period: "it will rain at once, turn to heavy rain in half an hour, turn to light rain an hour later and gradually stop raining in two hours".

The method for determining the descriptive information of the precipitation trend in the preset time period when the number of the precipitation waves in the preset time period is 1 is introduced in the abovementioned aspect, and the method for implementing determination of the descriptive information of the precipitation trend in the preset time period when the number of the precipitation waves in the preset time period is 2 will be introduced below in combination with FIG. 3.

Figure 3:
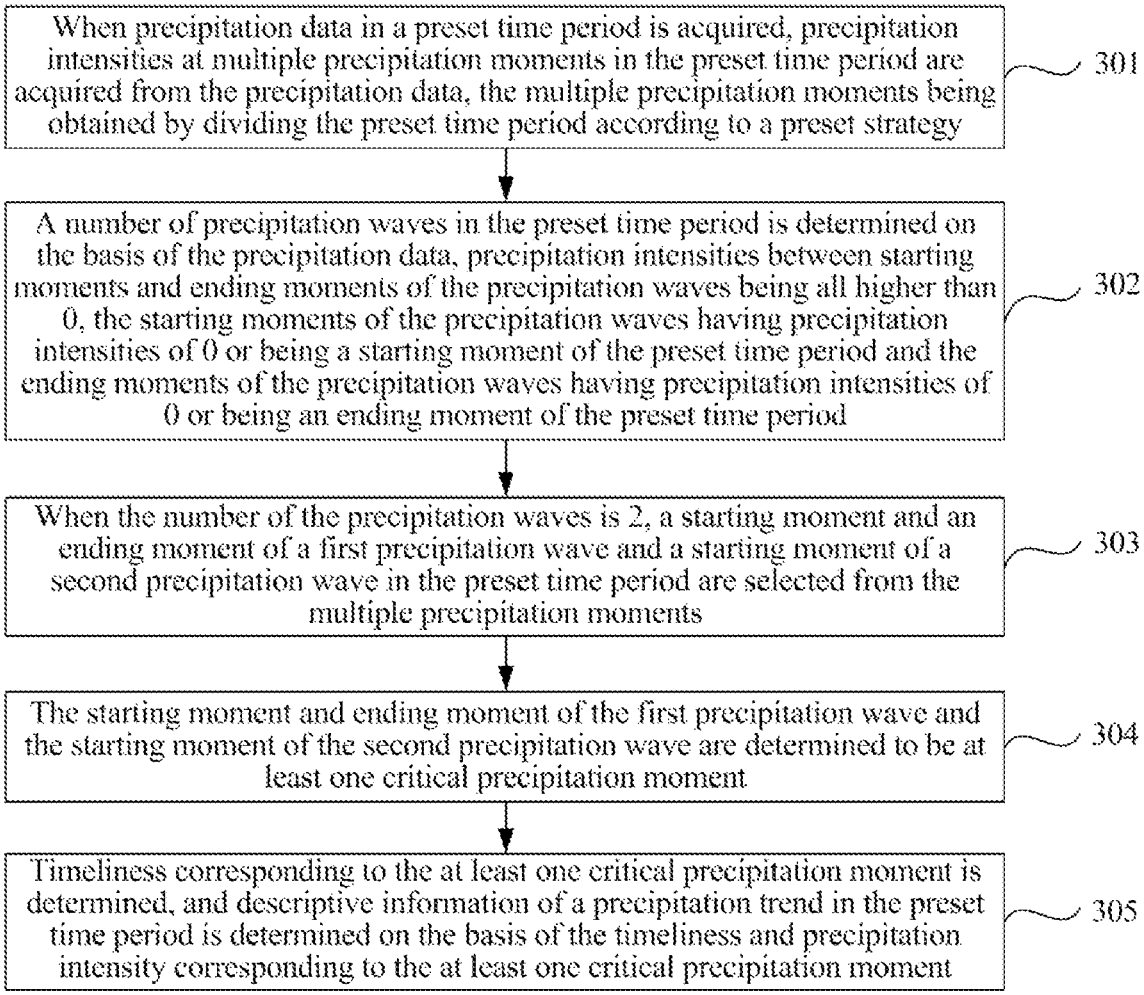
FIG. 3 is a flow chart showing a method for determining descriptive information of a precipitation trend, according to an exemplary aspect of the present disclosure.

FIG. 3 is a flow chart showing a method for determining descriptive information of a precipitation trend, according to an exemplary aspect. The method may be applied to a terminal, and may also be applied to an application server corresponding to a weather forecasting application installed in the terminal. Explanations and descriptions will be made with the terminal as an example in the aspect of the present disclosure. As shown in FIG. 3, the method includes the following steps.

In Step 301, when precipitation data in a preset time period is acquired, precipitation intensities at multiple precipitation moments in the preset time period are acquired from the precipitation data, the multiple precipitation moments being obtained by dividing the preset time period according to a preset strategy.

An implementation manner of the step may refer to the specific implementation manner in Step 201, and will not be elaborated in the aspect of the present disclosure.

After the precipitation intensities at the multiple precipitation moments in the precipitation data are acquired, the terminal may select at least one critical precipitation moment from the multiple precipitation moments on the basis of the precipitation intensities at the multiple precipitation moments by virtue of a method in Step 302-Step 304.

In Step 302, a number of precipitation waves in the preset time period is determined on the basis of the precipitation data, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period.

An implementation manner of the step may refer to the specific implementation manner in Step 202, and will not be elaborated in the aspect of the present disclosure.

In Step 303, when the number of the precipitation waves is 2, a starting moment and an ending moment of a first precipitation wave and a starting moment of a second precipitation wave in the preset time period are selected from the multiple precipitation moments.

When there exist two precipitation waves in the preset time period, for a user, clearly learning about occurrence time of the two precipitation waves is more significant than learning about a specific precipitation process in each precipitation wave of the two precipitation waves. Therefore, when there exist the two precipitation waves in the preset time period, the terminal may only select a starting moment and an ending moment of a first precipitation wave in the preset time period from the multiple precipitation moments, and is not required to acquire a turning-up moment and turning-down moment of each precipitation wave.

Wherein, the starting moment of the first precipitation wave may be the starting moment of the preset time period, and a precipitation intensity at the starting moment of the preset time period is not 0. Or, if the precipitation intensity at the starting moment of the preset time period is 0, the starting moment of the first precipitation wave may be the previous precipitation moment of a non-0 precipitation moment closest to the starting moment of the preset time period. The ending moment of the first precipitation wave may be the precipitation moment closest to the starting moment of the first precipitation wave and with the precipitation intensity 0 after the starting moment of the first precipitation wave.

In addition, the starting moment of the second precipitation wave is the precipitation moment closest to the ending moment of the preset time period and with the precipitation intensity 0.

In Step 304, the starting moment and ending moment of the first precipitation wave and the starting moment of the second precipitation wave are determined to be at least one critical precipitation moment.

Based on the descriptions in Step 303, for the user, the occurrence time of the first precipitation wave and the second precipitation wave is more referentially significant, so that the starting moment and ending moment of the first precipitation wave and the starting moment of the second precipitation wave are critical moments influencing descriptive information of a precipitation trend in the preset time period. Therefore, after acquiring the starting moment and ending moment of the first precipitation wave and the starting moment of the second precipitation wave, the terminal may directly determine the starting moment and ending moment of the first precipitation wave and the starting moment of the second precipitation wave to be the at least one critical precipitation moment.

In Step 305, timeliness corresponding to the at least one critical precipitation moment is determined, and descriptive information of a precipitation trend in the preset time period is determined on the basis of the timeliness and precipitation intensity corresponding to the at least one critical precipitation moment.

Wherein, when there exist the two precipitation waves in the preset time period, a chronological order the at least one critical precipitation moment is fixed, i.e. the starting moment of the first precipitation wave, the ending moment of the first precipitation wave and the starting moment of the second precipitation wave. At this moment, the terminal may determine a description manner corresponding to each critical precipitation moment with reference to the corresponding description manner introduced in Step 205, and then determine the descriptive information of the precipitation trend in the preset time period according to the method introduced in Step 205 for determining the descriptive information.

Optionally, when the starting moment and ending moment of the first precipitation wave correspond to the same time degree, the terminal may change the timeliness in the description manner corresponding to the ending moment of the first precipitation wave to be "then", and change the description manner corresponding to the starting moment of the second precipitation wave to be <the timeliness corresponding to the starting moment of the second precipitation wave>+"it will rain again".

Optionally, when the ending moment of the first precipitation wave and the starting moment of the second precipitation wave correspond to the same time degree, the timeliness in the description manner corresponding to the starting moment of the second precipitation wave is changed to be "then again".

Optionally, when the three critical precipitation moments correspond to the same time degree, the description manners of the ending moment of the first precipitation wave and the starting moment of the second precipitation wave are eliminated, and the descriptive information of the precipitation trend in the preset time period is directly determined according to the description manner corresponding to the starting moment of the first precipitation wave.

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing a critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

In addition, in the aspect of the present disclosure, when the number of the precipitation waves in the preset time period is 2, the terminal may select a starting moment and an ending moment of a first precipitation wave and a starting moment of a second precipitation wave in the preset time period from the multiple precipitation moments to be the critical precipitation moments, and determine the descriptive information of the precipitation trend in the preset time period. For the user, when there exist the two precipitation waves in the preset time period, clearly learning about the occurrence time of the two precipitation waves is more significant than learning about the specific precipitation process in each precipitation wave of the two precipitation waves. Therefore, the method for determining the descriptive information of the precipitation trend of the preset time period is more referentially significant for guiding travel of the user and more consistent with a requirement of the user.

The method for determining the descriptive information of the precipitation trend in the preset time period when the number of the precipitation waves in the preset time period is 2 is introduced in the abovementioned aspect, and a method for implementing determination of the descriptive information of the precipitation trend in the preset time period when the number of the precipitation waves in the preset time period is equal to or more than 3 will be introduced below in combination with FIG. 3.

Figure 4:
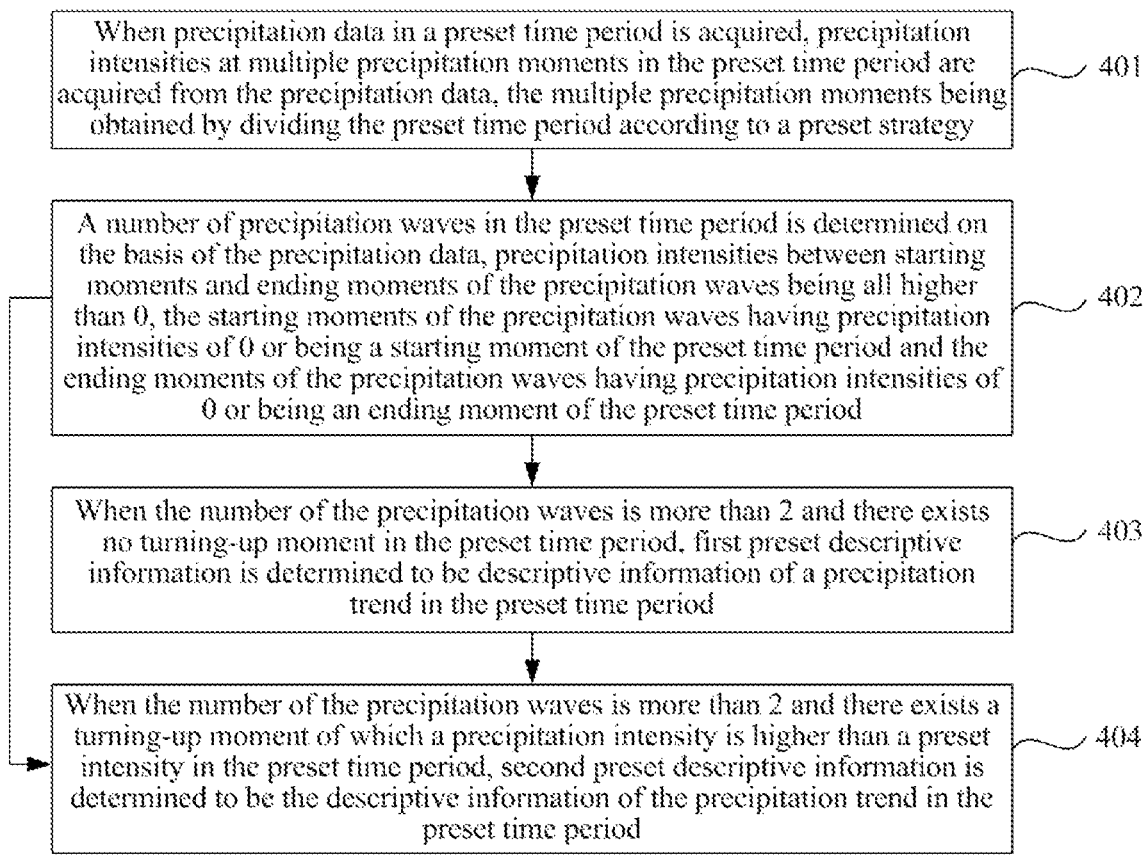
FIG. 4 is a flow chart showing a method for determining descriptive information of a precipitation trend, according to an exemplary aspect of the present disclosure.

FIG. 4 is a flow chart showing a method for determining descriptive information of a precipitation trend, according to an exemplary aspect. The method may be applied to a terminal, and may also be applied to an application server corresponding to a weather forecasting application installed in the terminal. Explanations and descriptions will be made with the terminal as an example in the aspect of the present disclosure. As shown in FIG. 4, the method includes the following steps.

In Step 401, when precipitation data in a preset time period is acquired, precipitation intensities at multiple precipitation moments in the preset time period are acquired from the precipitation data, the multiple precipitation moments being obtained by dividing the preset time period according to a preset strategy.

An implementation manner of the step may refer to the specific implementation manner in Step 201, and will not be elaborated in the aspect of the present disclosure.

In Step 402, a number of precipitation waves in the preset time period is determined on the basis of the precipitation data, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period.

An implementation manner of the step may refer to the specific implementation manner in Step 202, and will not be elaborated in the aspect of the present disclosure.

In Step 403, when the number of the precipitation waves is more than 2 and there exists no turning-up moment in the preset time period, first preset descriptive information is determined to be descriptive information of a precipitation trend in the preset time period.

Since the method provided by the aspect of the present disclosure for determining the descriptive information of the precipitation trend is mainly for a relatively short preset time period, when there exist three precipitation waves in the preset time period and no turning-up moment exists, it may be determined that the precipitation intensities at the multiple precipitation moments in the preset time period are at a first precipitation intensity level, and at this moment, the terminal may determine the first preset descriptive information configured to describe continuous fine drizzling rain in the preset time period to be the descriptive information of the precipitation trend in the preset time period.

Wherein, the first preset descriptive information may be that "it is spotting with rain". Of course, the first preset descriptive information may also be other descriptive information capable of expressing the meaning.

In Step 404, when the number of the precipitation waves is more than 2 and there exists a turning-up moment of which a precipitation intensity is higher than a preset intensity in the preset time period, second preset descriptive information is determined to be the descriptive information of the precipitation trend in the preset time period.

Besides the condition, described in Step 403, that no turning-up moment exists, if there exists the turning-up moment of which the precipitation intensity is higher than the preset intensity in the preset time period, it may be determined that the precipitation intensities at the multiple precipitation moments in the preset time period are not at the first precipitation intensity level all the time, that is, precipitation exists all the time in the preset time period, and at this moment, the terminal may determine the second preset descriptive information configured to describe continuous precipitation of the preset time period to be the descriptive information of the precipitation trend in the preset time period.

Wherein, the second preset descriptive information may be that "it will keep raining within a period of time in the future". Of course, the second preset descriptive information may also be other descriptive information capable of expressing the meaning.

In the aspect of the present disclosure, when the precipitation data in the preset time period is acquired, at least one critical precipitation moment is selected from the multiple precipitation moments according to the precipitation intensities at the multiple precipitation moments in the preset time period, and the precipitation trend in the preset time period is determined according to timeliness and precipitation intensity corresponding to the at least one critical precipitation moment. In the aspect of the present disclosure, the descriptive information of the precipitation trend in the preset time period may be determined according to the critical precipitation moment playing a critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

In addition, in the aspect of the present disclosure, when the number of the precipitation waves in the preset time period is more than 2, the descriptive information may be determined according to whether there exists a turning-up moment or not or according to whether the turning-up moment higher than the preset precipitation intensity exists or not. Since the method provided by the aspect of the present disclosure for determining the descriptive information of the precipitation trend is mainly for a relatively short preset time period, when the number of the precipitation waves in the preset time period is more than 2, the precipitation trend of the preset time period may be obtained by judging whether there exists a turning-up moment in the preset time period or not or whether the turning-up moment higher than the preset precipitation intensity exists or not, and an operation of determining the descriptive information of the precipitation trend is more simplified.

The methods for determining the descriptive information of the precipitation trend in the preset time period in case of different numbers of the precipitation waves are explained and described in detail through the abovementioned aspects in combination with FIGS. 2, 3 and 4. After the descriptive information of the precipitation trend in the preset time period is determined, the terminal may further determine travel prompting information corresponding to the precipitation trend of the preset time period according to the timeliness and precipitation intensities corresponding to the multiple precipitation moments in the preset time period. Determination of the travel prompting information under different conditions will be introduced in the aspect.

It is important to note that, for at least one precipitation wave in the preset time period, the terminal may determine travel prompting information corresponding to each precipitation wave according to the critical precipitation moments of each precipitation wave, and then the terminal may add the travel prompting information corresponding to each precipitation wave into a corresponding position in the determined descriptive information, the corresponding position referring to an ending moment of the precipitation trend corresponding to the travel prompting information in the descriptive information.

When the precipitation intensity at the starting moment of the preset time period is located in the first precipitation intensity range, there exists a critical turning-up moment between the starting moment of the preset time period and a first preset moment and the precipitation intensity at the critical turning-up moment is equal to a first preset precipitation intensity, first preset travel prompting information is determined to be the travel prompting information corresponding to the precipitation trend in the preset time period, a minimum precipitation intensity in the first precipitation intensity range being 0.

Wherein, for example, the preset time period is two hours, and the abovementioned time bucket and precipitation intensity level division manners are adopted. The first precipitation intensity range may be [0,0.35], the first preset moment may be 10 minutes, and the first preset precipitation intensity may be 0.35. At this moment, it will suddenly rain heavily in the preset time period, and the first preset travel prompting information may be "Seek for a shelter from the rain".

When the precipitation intensity at the starting moment of the preset time period is located in a second precipitation intensity range, there exists a critical turning-down moment between the starting moment of the preset time period and the first preset moment, a precipitation intensity at the critical turning-down moment is a second preset precipitation intensity and the precipitation intensities at all the precipitation moments between the first preset moment and the second preset moment are lower than a third precipitation intensity, second preset travel prompting information is determined to be the travel prompting information corresponding to the precipitation trend in the preset time period, the first preset moment being earlier than the second preset moment.

Wherein, for example, the preset time period is two hours, and the abovementioned time bucket and precipitation intensity level division manners are adopted. The second precipitation intensity range may be [0.25,1], the second preset moment may be 60 minutes, at this moment, it can be learned about that the precipitation trend in the preset time period may be sudden abatement of moderate/heavy rain, and under such a condition, the second preset travel prompting information may be "Go out later".

When the precipitation intensity at the starting moment of the preset time period is located in the second precipitation intensity range and the ending moment of the last precipitation wave in the preset time period is located between the starting moment of the preset time period and a third preset moment, third preset travel prompting information is determined to be the travel prompting information corresponding to the precipitation trend in the preset time period, the second preset moment being earlier than the third preset moment.

Wherein, for example, the preset time period is two hours, and the abovementioned time bucket and precipitation intensity level division manners are adopted. The second precipitation intensity range may be [0.25,1], the third preset moment may be 30 minutes, at this moment, it can be learned about that the precipitation trend in the preset time period may be sudden stopping of moderate/heavy rain, and under such a condition, the third preset travel prompting information may be "Watch out the water on the ground".

When the precipitation intensity at the starting moment in the preset time period is located in a third precipitation intensity range and the ending moment of the last precipitation wave in the preset time is located between the starting moment of the preset time period and the third preset moment, fourth preset travel prompting information is determined to be the travel prompting information corresponding to the precipitation trend in the preset time period, a minimum precipitation intensity in the third precipitation intensity range being 0, a maximum precipitation intensity in the first precipitation intensity range being higher than a maximum precipitation intensity in the third precipitation intensity range and a minimum precipitation intensity in the second precipitation intensity range being equal to the maximum precipitation intensity in the third precipitation intensity range.

Wherein, for example, the preset time period is two hours, and the abovementioned time bucket and precipitation intensity level division manners are adopted. The third precipitation intensity range may be [0,0.25], the third preset moment may be 30 minutes, at this moment, it can be learned about that the precipitation trend in the preset time period may be sudden stopping of light rain, and under such a condition, the fourth preset travel prompting information may be "Watch out the slippery ground".

When there exists a critical turning-down moment between the starting moment of the preset time period and the third preset moment, or, when the ending moment of the last precipitation wave in the preset time period is located between the starting moment of the preset time period and the third preset moment, fifth preset travel prompting information is determined to be the travel prompting information corresponding to the precipitation trend in the preset time period.

Wherein, for example, the preset time period is two hours, and the abovementioned time bucket and precipitation intensity level division manners are adopted. The third preset moment may be 30 minutes, at this moment, it can be learned about that the precipitation trend in the preset time period may be that it will rain and suddenly stop raining, and under such a condition, the fifth preset travel prompting information may be "Watch out the slippery ground".

In the aspect of the present disclosure, after the descriptive information of the precipitation trend of the preset time period is determined, the travel prompting information corresponding to the precipitation trend of the preset time period may be determined according to the timeliness and precipitation intensity corresponding to the critical precipitation moment in the preset time period, that is, various distinctive precipitation trends may be accurately found according to the critical precipitation moment in the aspect of the present disclosure, thereby setting different personalized travel prompting information for different precipitation trends and bringing convenience to travel of the user.

Figure 5A:
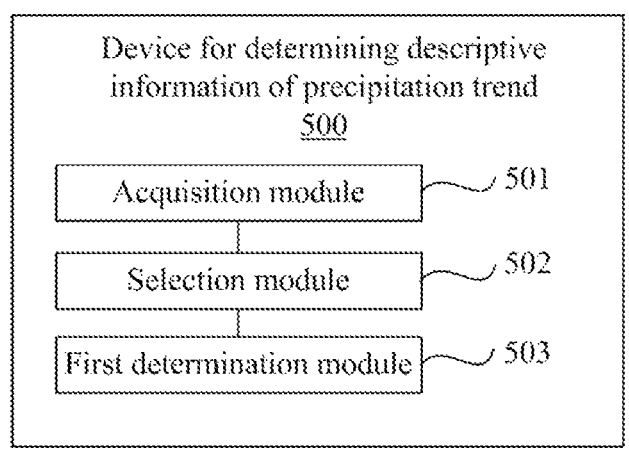
FIG. 5A is a block diagram of a device for determining descriptive information of a precipitation trend, according to an exemplary aspect of the present disclosure.

FIG. 5A is a block diagram of a device 500 for determining descriptive information of a precipitation trend, according to an exemplary aspect. Referring to FIG. 5A, the device 500 includes an acquisition module 501, a selection module 502 and a first determination module 503.

The acquisition module 501 is configured to, when precipitation data in a preset time period is acquired, acquire precipitation intensities at multiple precipitation moments in the preset time period from the precipitation data, the multiple precipitation moments being obtained by dividing the preset time period according to a preset strategy.

The selection module 502 is configured to select at least one critical precipitation moment from the multiple precipitation moments on the basis of the precipitation intensities at the multiple precipitation moments, the at least one critical precipitation moment referring to a precipitation moment playing a critical role in descriptive information of a precipitation trend in the preset time period.

The first determination module 503 is configured to determine timeliness corresponding to the at least one critical precipitation moment, and determine the descriptive information of the precipitation trend in the preset time period on the basis of the timeliness and precipitation intensity corresponding to the at least one critical precipitation moment.

Figure 5B:
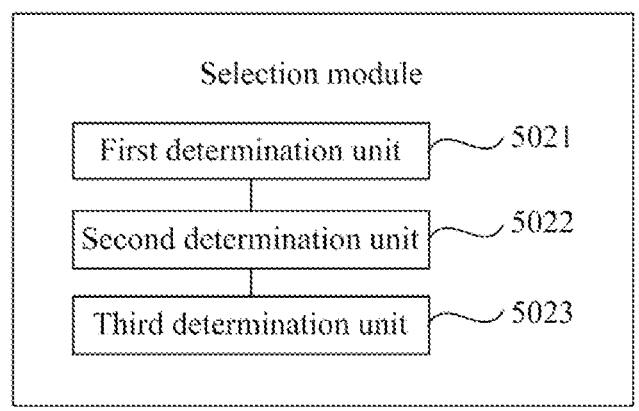
FIG. 5B is a block diagram of a selection module, according to an exemplary aspect of the present disclosure.

Optionally, referring to FIG. 5B, the selection module 502 includes:

a first determination unit 5021, configured to determine a number of precipitation waves in the preset time period on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;

a second determination unit 5022, configured to, when the number of the precipitation waves is 1, determine at least one turning-up moment and at least one turning-down moment in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and a third determination unit 5023, configured to determine the at least one critical precipitation moment on the basis of the starting moment and ending moment of the precipitation wave, the at least one turning-up moment and the at least one turning-down moment.

Optionally, the third determination unit 5023 includes:

a first determination subunit, configured to determine a critical turning-up moment in the at least one turning-up moment, and determine a critical turning-down moment in the at least one turning-down moment;

a second determination subunit, configured to, when the precipitation intensity at the next precipitation moment adjacent to the critical turning-up moment is higher than a precipitation intensity at the starting moment of the preset time period and precipitation intensity levels of the precipitation intensities in a preset continuous time duration after the critical turning-up moment do not change, determine the starting moment and ending moment of the precipitation wave, the critical turning-up moment, the next precipitation moment adjacent to the critical turning-up moment, the critical turning-down moment and the next precipitation moment adjacent to the critical turning-down moment to be the at least one critical precipitation moment; and a third determination subunit, configured to, when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, the starting moment and ending moment of the precipitation wave, determine the critical turning-down moment and the next precipitation moment adjacent to the critical turning-down moment to be the at least one critical precipitation moment.

Optionally, the first determination subunit is configured to:

when there are turning-up moments of which the precipitation intensities are at different precipitation intensity levels in the at least one turning-up moment, determine a turning-up moment with the maximum precipitation intensity in the at least one turning-up moment to be the critical turning-up moment; and when the precipitation intensity at the at least one turning-up moment is at a same precipitation intensity level, determine an earliest turning-up moment to be the critical turning-up moment.

Optionally, the first determination subunit is configured to:

when there are turning-down moments of which the precipitation intensities are at different precipitation intensity levels in the at least one turning-down moment, determine a turning-down moment with the minimum precipitation intensity in the at least one turning-down moment to be the critical turning-down moment; and when the precipitation intensity at the at least one turning-down moment is at a same precipitation intensity level, determine a turning-down moment closest to the ending moment of the preset time period to be the critical turning-down moment.

Figure 5C:
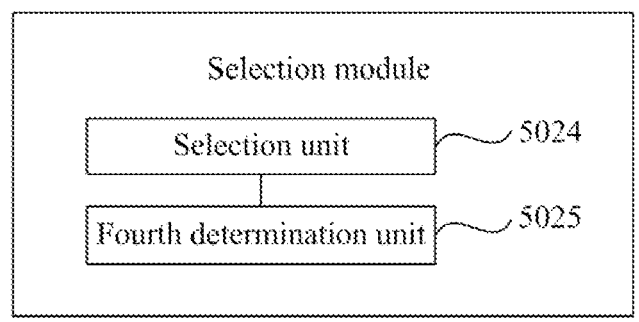
FIG. 5C is a block diagram of another selection module, according to an exemplary aspect of the present disclosure.

Optionally, referring to FIG. 5C, the selection module 502 further includes:

a selection unit 5024, configured to, when the number of the precipitation waves is 2, select a starting moment and an ending moment of a first precipitation wave and a starting moment of a second precipitation wave in the preset time period from the multiple precipitation moments; and a fourth determination unit 5025, configured to determine the starting moment and ending moment of the first precipitation wave and the starting moment of the second precipitation wave to be the at least one critical precipitation moment.

Figure 5D:
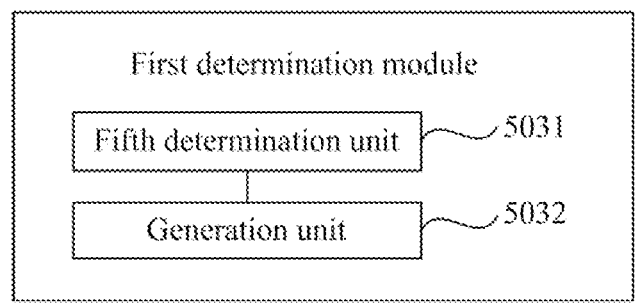
FIG. 5D is a block diagram of a first determination module, according to an exemplary aspect of the present disclosure.

Optionally, referring to FIG. 5D, the first determination module 503 includes:

a fifth determination unit 5031, configured to determine description manner corresponding to each critical precipitation moment of the at least one critical precipitation moment; and a generation unit 5032, configured to generate the descriptive information of the precipitation trend in the preset time period in the description manner corresponding to each critical precipitation moment according to a chronological order the at least one critical precipitation moment on the basis of the timeliness and precipitation intensity corresponding to the at least one critical precipitation moment.

Figure 5E:
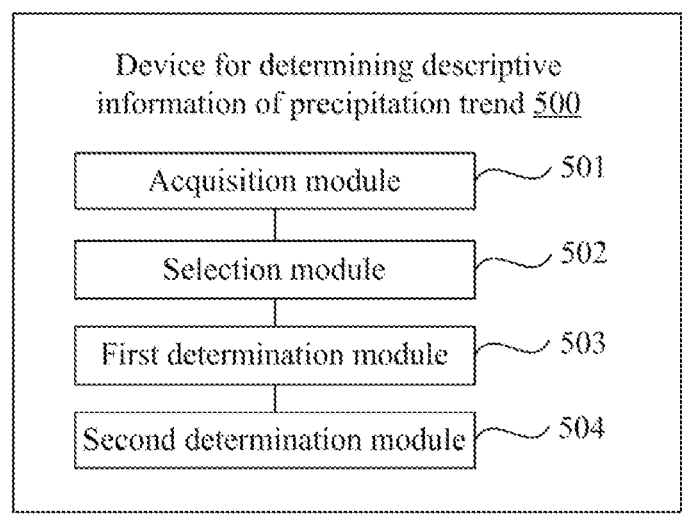
FIG. 5E is a block diagram of a device for determining descriptive information of a precipitation trend, according to an exemplary aspect of the present disclosure.

Optionally, referring to FIG. 5E, the device further includes:

a second determination module 504, configured to determine travel prompting information corresponding to the precipitation trend in the preset time period on the basis of timeliness and precipitation intensities corresponding to the multiple precipitation moments.

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing the critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

In addition, in the aspect of the present disclosure, the critical precipitation moment is determined to screen some sudden change data or precipitation data of frequently changing precipitation intensities in the preset time period to avoid influence of the sudden change data on the whole precipitation trend, the descriptive information of the precipitation trend of the preset time period is determined according to the critical precipitation moment, and may reflect the overall precipitation trend of the preset time period more intuitively compared with the descriptive information determined by the exhaustion method in the related technology, that is, the terminal may put greater emphasis on description of some long-lasting precipitation trends with great influence on the user, and greater referential significance for guiding travel of the user is achieved.

It is also important to note that, in the aspect of the present disclosure, after the descriptive information of the precipitation trend of the preset time period is determined, the travel prompting information corresponding to the precipitation trend of the preset time period may be determined according to the timeliness and precipitation intensity corresponding to the critical precipitation moment in the preset time period, that is, various distinctive precipitation trends may be accurately found according to the critical precipitation moment in the aspect of the present disclosure, thereby setting different personalized travel prompting information for different precipitation trends and bringing convenience to travel of the user.

With respect to the device in the above aspect, the specific manners for performing operations for individual modules therein have been described in detail in the aspect regarding the method, which will not be elaborated herein.

Figure 6:
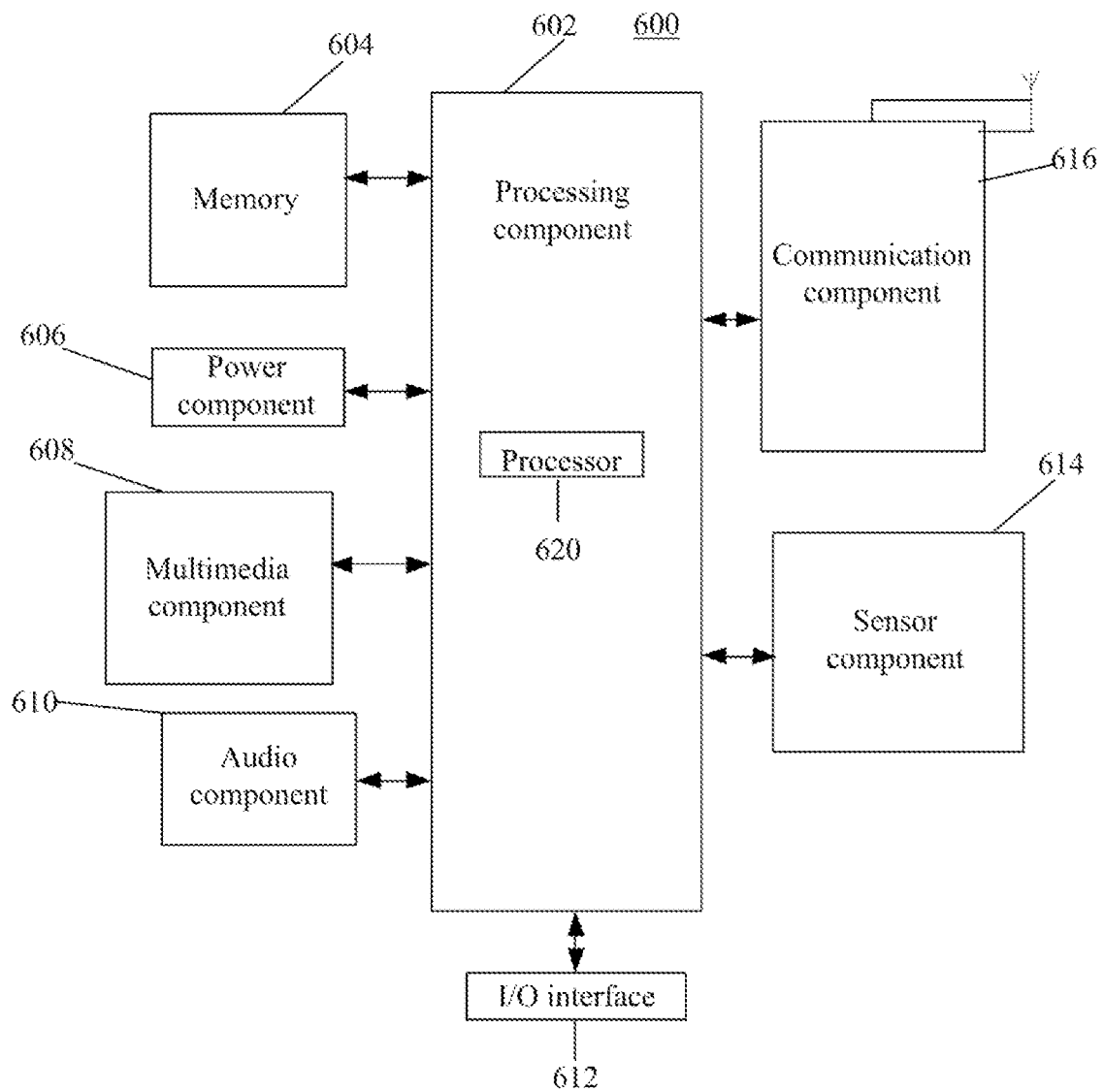
FIG. 6 is a block diagram of a device for determining descriptive information of a precipitation trend, according to an exemplary aspect of the present disclosure.

FIG. 6 is a block diagram of a device 600 for determining descriptive information of a precipitation trend, according to an exemplary aspect. For example, the device 600 may be a mobile phone, a computer, a digital broadcast terminal, a messaging device, a gaming console, a tablet, a medical device, exercise equipment, a personal digital assistant and the like.

Referring to FIG. 6, the device 600 may include one or more of the following components: a processing component 602, a memory 604, a power component 606, a multimedia component 608, an audio component 610, an Input/Output (I/O) interface 612, a sensor component 614, and a communication component 616.

The processing component 602 typically controls overall operations of the device 600, such as the operations associated with display, telephone calls, data communications, camera operations, and recording operations. The processing component 602 may include one or more processors 620 to execute instructions to perform all or part of the steps in the abovementioned method. Moreover, the processing component 602 may include one or more modules which facilitate interaction between the processing component 602 and the other components. For instance, the processing component 602 may include a multimedia module to facilitate interaction between the multimedia component 608 and the processing component 602.

The memory 604 is configured to store various types of data to support the operation of the device 600. Examples of such data include instructions for any application programs or methods operated on the device 600, contact data, phonebook data, messages, pictures, video, etc. The memory 604 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 606 provides power for various components of the device 600. The power component 606 may include a power management system, one or more power supplies, and other components associated with the generation, management and distribution of power for the device 600.

The multimedia component 608 includes a screen providing an output interface between the device 600 and a user. In some aspects, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also detect a duration and pressure associated with the touch or swipe action. In some aspects, the multimedia component 608 includes a front camera and/or a rear camera. The front camera and/or the rear camera may receive external multimedia data when the device 600 is in an operation mode, such as a photographing mode or a video mode. Each of the front camera and the rear camera may be a fixed optical lens system or have focusing and optical zooming capabilities.

The audio component 610 is configured to output and/or input an audio signal. For example, the audio component 610 includes a Microphone (MIC), and the MIC is configured to receive an external audio signal when the device 600 is in the operation mode, such as a call mode, a recording mode and a voice recognition mode. The received audio signal may be further stored in the memory 604 or sent through the communication component 616. In some aspects, the audio component 610 further includes a speaker configured to output the audio signal.

The I/O interface 612 provides an interface between the processing component 602 and a peripheral interface module, and the peripheral interface module may be a keyboard, a click wheel, a button and the like. The button may include, but not limited to: a home button, a volume button, a starting button and a locking button.

The sensor component 614 includes one or more sensors configured to provide status assessment in various aspects for the device 600. For instance, the sensor component 614 may detect an on/off status of the device 600 and relative positioning of components, such as a display and small keyboard of the device 600, and the sensor component 614 may further detect a change in a position of the device 600 or a component of the device 600, presence or absence of contact between the user and the device 600, orientation or acceleration/deceleration of the device 600 and a change in temperature of the device 600. The sensor component 614 may include a proximity sensor configured to detect presence of an object nearby without any physical contact. The sensor component 614 may also include a light sensor, such as a Complementary Metal Oxide Semiconductor (CMOS) or Charge Coupled Device (CCD) image sensor, configured for use in an imaging application. In some aspects, the sensor component 614 may also include an acceleration sensor, a gyroscope sensor, a magnetic sensor, a pressure sensor or a temperature sensor.

The communication component 616 is configured to facilitate wired or wireless communication between the device 600 and other equpment. The device 600 may access a communication-standard-based wireless network, such as a Wireless Fidelity (WiFi) network, a 2nd-Generation (2G) or 3rd-Generation (3G) network or a combination thereof. In an exemplary aspect, the communication component 616 receives a broadcast signal or broadcast associated information from an external broadcast management system through a broadcast channel. In an exemplary aspect, the communication component 616 further includes a Near Field Communciation (NFC) module to facilitate short-range communication. For example, the NFC module may be implemented on the basis of a Radio Frequency Identification (RFID) technology, an Infrared Data Association (IrDA) technology, an Ultra-WideBand (UWB) technology, a Bluetooth (BT) technology and another technology.

In an exemplary aspect, the device 600 may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the methods provided by the aspects shown in FIG. 1B-4.

In an exemplary aspect, there is also provided a non-transitory computer-readable storage medium including an instruction, such as the memory 604 including an instruction, and the instruction may be executed by the processor 620 of the device 600 to implement the abovementioned method. For example, the non-transitory computer-readable storage medium may be a ROM, a Random Access Memory (RAM), a Compact Disc Read-Only Memory (CD-ROM), a magnetic tape, a floppy disc, optical data storage equipment and the like.

A non-transitory computer-readable storage medium is provided, and when an instruction in the storage medium is executed by a processor of a mobile terminal, the mobile terminal may execute a method for determining descriptive information of a precipitation trend, the method including that:

when precipitation data in a preset time period is acquired, precipitation intensities at multiple precipitation moments in the preset time period are acquired from the precipitation data, the multiple precipitation moments being obtained by dividing the preset time period according to a preset strategy;

at least one critical precipitation moment is selected from the multiple precipitation moments on the basis of the precipitation intensities at the multiple precipitation moments, the at least one critical precipitation moment referring to a precipitation moment playing a critical role in descriptive information of a precipitation trend in the preset time period; and timeliness corresponding to the at least one critical precipitation moment is determined, and the descriptive information of the precipitation trend in the preset time period is determined on the basis of the timeliness and precipitation intensity corresponding to the at least one critical precipitation moment.

Optionally, the operation that the at least one critical precipitation moment is selected from the multiple precipitation moments on the basis of the precipitation intensities at the multiple precipitation moments includes that:

a number of precipitation waves in the preset time period is determined on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;

when the number of the precipitation waves is 1, at least one turning-up moment and at least one turning-down moment are determined in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and the at least one critical precipitation moment is determined on the basis of the starting moment and ending moment of the precipitation wave, the at least one turning-up moment and the at least one turning-down moment.

Optionally, the operation that the at least one critical precipitation moment is determined on the basis of the starting moment and ending moment of the precipitation wave, the at least one turning-up moment and the at least one turning-down moment includes that:

a critical turning-up moment is determined in the at least one turning-up moment, and a critical turning-down moment is determined in the at least one turning-down moment;

when the precipitation intensity at the next precipitation moment adjacent to the critical turning-up moment is higher than a precipitation intensity at the starting moment of the preset time period and precipitation intensity levels of the precipitation intensities in a preset continuous time duration after the critical turning-up moment do not change, the starting moment and ending moment of the precipitation wave, the critical turning-up moment, the next precipitation moment adjacent to the critical turning-up moment, the critical turning-down moment and the next precipitation moment adjacent to the critical turning-down moment are determined to be the at least one critical precipitation moment; and when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, the starting moment and ending moment of the precipitation wave, the critical turning-down moment and the next precipitation moment adjacent to the critical turning-down moment are determined to be the at least one critical precipitation moment.

Optionally, the operation that the critical turning-up moment is determined in the at least one turning-up moment includes that:

when there are turning-up moment of which the precipitation intensities are at different precipitation intensity levels in the at least one turning-up moment, a turning-up moment with the maximum precipitation intensity in the at least one turning-up moment is determined to be the critical turning-up moment; and when the precipitation intensity at the at least one turning-up moment is at a same precipitation intensity level, an earliest turning-up moment is determined to be the critical turning-up moment.

Optionally, the operation that the critical turning-down moment is determined in the at least one turning-down moment includes that:

when there are turning-down moments of which the precipitation intensities are at different precipitation intensity levels in the at least one turning-down moment, a turning-down moment with the minimum precipitation intensity in the at least one turning-down moment is determined to be the critical turning-down moment; and when the precipitation intensity at the at least one turning-down moment is at a same precipitation intensity level, a turning-down moment closest to the ending moment of the preset time period is determined to be the critical turning-down moment.

Optionally, after the operation that the number of the precipitation waves in the preset time period is determined on the basis of the precipitation data, the method further includes that:

when the number of the precipitation waves is 2, a starting moment and an ending moment of a first precipitation wave and a starting moment of a second precipitation wave in the preset time period are selected from the multiple precipitation moments; and the starting moment and ending moment of the first precipitation wave and the starting moment of the second precipitation wave are determined to be the at least one critical precipitation moment.

Optionally, the operation that the descriptive information of the precipitation trend in the preset time period is determined on the basis of the timeliness and precipitation intensity corresponding to the at least one critical precipitation moment includes that:

a description manner corresponding to each critical precipitation moment of the at least one critical precipitation moment is determined; and the descriptive information of the precipitation trend in the preset time period is generated in the description manner corresponding to each critical precipitation moment according to a chronological order the at least one critical precipitation moment on the basis of the timeliness and precipitation intensity corresponding to the at least one critical precipitation moment.

Optionally, after the operation that the descriptive information of the precipitation trend in the preset time period is determined on the basis of the timeliness and precipitation intensity corresponding to the at least one critical precipitation moment, the method further includes that:

travel prompting information corresponding to the precipitation trend in the preset time period is determined on the basis of timeliness and precipitation intensities corresponding to the multiple precipitation moments.

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing the critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

Figure 7:
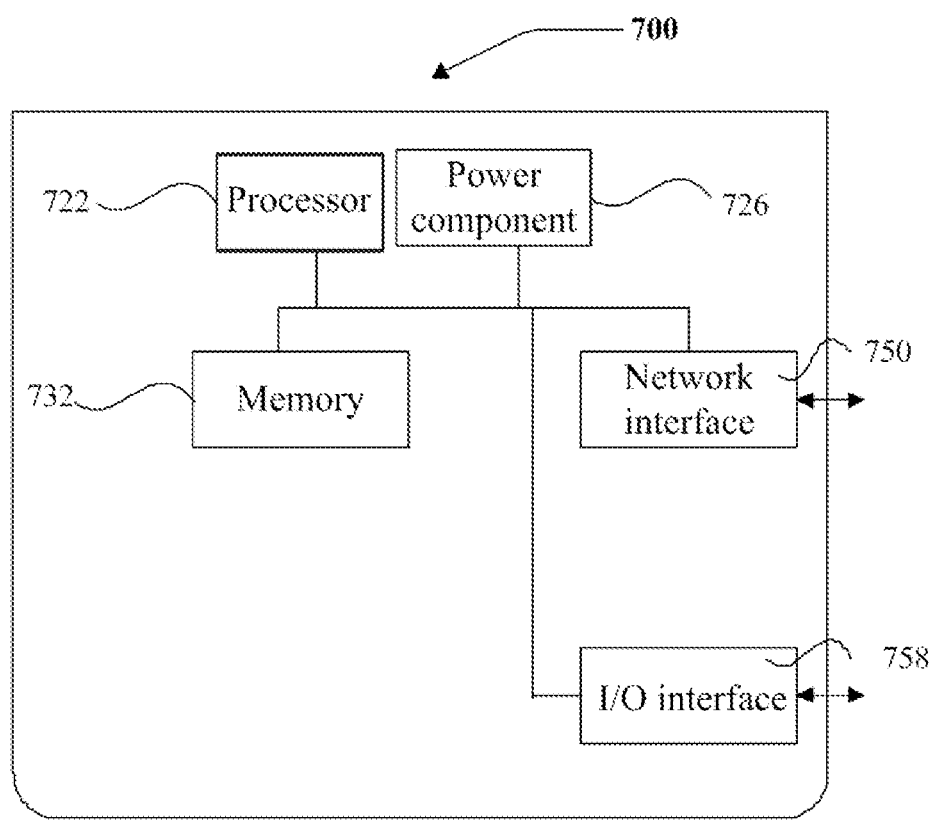
FIG. 7 is a block diagram of a device for determining descriptive information of a precipitation trend, according to an exemplary aspect of the present disclosure.

FIG. 7 is a block diagram of a device 700 for determining descriptive information of a precipitation trend, according to an exemplary aspect. For example, the device 700 may be provided as a server. Referring to FIG. 7, the device 700 includes a processor 722, which further includes one or more processors, and a memory resource represented by a memory 732, configured to store instructions executable by the processor 722, such as application programs. The application programs stored in the memory 732 may include one or more than one module of which each corresponds to a set of instructions. In addition, the processor 722 is configured to execute the instructions to execute the methods provided by the aspects show in FIG. 1B-4.

The device 700 may further include a power component 726 configured to execute power management of the device 700, a wired or wireless network interface 750 configured to connect the device 700 to a network, and an I/O interface 758. The device 700 may be operated on the basis of an operating system stored in the memory 732, for example, Windows Server™, Mac OS X™, Unix™, Linux™ or FreeBSD™.

In an exemplary aspect, there is also provided a non-transitory computer-readable storage medium including instructions, such as the memory 732 including the instructions, and the instructions may be executed by the processor 722 of the device 700 to perform the abovementioned method. For example, the non-transitory computer-readable storage medium may be a ROM, a RAM, a CD-ROM, a magnetic tape, a floppy disc, optical data storage equipment and the like.

A non-transitory computer-readable storage medium is provided, and when an instruction in the storage medium is executed by a processor of a mobile terminal, the mobile terminal may execute a method for determining descriptive information of a precipitation trend, the method including that:

when precipitation data in a preset time period is acquired, precipitation intensities at multiple precipitation moments in the preset time period are acquired from the precipitation data, the multiple precipitation moments being obtained by dividing the preset time period according to a preset strategy;

at least one critical precipitation moment is selected from the multiple precipitation moments on the basis of the precipitation intensities at the multiple precipitation moments, the at least one critical precipitation moment referring to a precipitation moment playing a critical role in descriptive information of a precipitation trend in the preset time period; and timeliness corresponding to the at least one critical precipitation moment is determined, and the descriptive information of the precipitation trend in the preset time period is determined on the basis of the timeliness and precipitation intensity corresponding to the at least one critical precipitation moment.

Optionally, the operation that the at least one critical precipitation moment is selected from the multiple precipitation moments on the basis of the precipitation intensities at the multiple precipitation moments includes that:

a number of precipitation waves in the preset time period is determined on the basis of the precipitation intensities at the multiple precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;

when the number of the precipitation waves is 1, at least one turning-up moment and at least one turning-down moment are determined in the multiple precipitation moments on the basis of the precipitation intensities at the multiple precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and the at least one critical precipitation moment is determined on the basis of the starting moment and ending moment of the precipitation wave, the at least one turning-up moment and the at least one turning-down moment.

Optionally, the operation that the at least one critical precipitation moment is determined on the basis of the starting moment and ending moment of the precipitation wave, the at least one turning-up moment and the at least one turning-down moment includes that:

a critical turning-up moment is determined in the at least one turning-up moment, and a critical turning-down moment is determined in the at least one turning-down moment;

when the precipitation intensity at the next precipitation moment adjacent to the critical turning-up moment is higher than a precipitation intensity at the starting moment of the preset time period and precipitation intensity levels of the precipitation intensities in a preset continuous time duration after the critical turning-up moment do not change, the starting moment and ending moment of the precipitation wave, the critical turning-up moment, the next precipitation moment adjacent to the critical turning-up moment, the critical turning-down moment and the next precipitation moment adjacent to the critical turning-down moment are determined to be the at least one critical precipitation moment; and when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, the starting moment and ending moment of the precipitation wave, the critical turning-down moment and the next precipitation moment adjacent to the critical turning-down moment are determined to be the at least one critical precipitation moment.

Optionally, the operation that the critical turning-up moment is determined in the at least one turning-up moment includes that:

when there are turning-up moments of which the precipitation intensities are at different precipitation intensity levels in the at least one turning-up moment, a turning-up moment with the maximum precipitation intensity in the at least one turning-up moment is determined to be the critical turning-up moment; and when the precipitation intensity at the at least one turning-up moment is at a same precipitation intensity level, an earliest turning-up moment is determined to be the critical turning-up moment.

Optionally, the operation that the critical turning-down moment is determined in the at least one turning-down moment includes that:

when there are turning-down moments of which the precipitation intensities are at different precipitation intensity levels in the at least one turning-down moment, a turning-down moment with the minimum precipitation intensity in the at least one turning-down moment is determined to be the critical turning-down moment; and when the precipitation intensity at the at least one turning-down moment is at a same precipitation intensity level, a turning-down moment closest to the ending moment of the preset time period is determined to be the critical turning-down moment.

Optionally, after the operation that the number of the precipitation waves in the preset time period is determined on the basis of the precipitation data, the method further includes that:

when the number of the precipitation waves is 2, a starting moment and an ending moment of a first precipitation wave and a starting moment of a second precipitation wave in the preset time period are selected from the multiple precipitation moments; and the starting moment and ending moment of the first precipitation wave and the starting moment of the second precipitation wave are determined to be the at least one critical precipitation moment.

Optionally, the operation that the descriptive information of the precipitation trend in the preset time period is determined on the basis of the timeliness and precipitation intensity corresponding to the at least one critical precipitation moment includes that:

a description manner corresponding to each critical precipitation moment of the at least one critical precipitation moment is determined; and the descriptive information of the precipitation trend in the preset time period is generated in the description manner corresponding to each critical precipitation moment according to a chronological order the at least one critical precipitation moment on the basis of the timeliness and precipitation intensity corresponding to the at least one critical precipitation moment.

Optionally, after the operation that the descriptive information of the precipitation trend in the preset time period is determined on the basis of the timeliness and precipitation intensity corresponding to the at least one critical precipitation moment, the method further includes that:

travel prompting information corresponding to the precipitation trend in the preset time period is determined on the basis of timeliness and precipitation intensities corresponding to the multiple precipitation moments.

In the aspect of the present disclosure, when the precipitation data in the preset time period is acquired, the at least one critical precipitation moment is selected from the multiple precipitation moments according to the precipitation intensities at the multiple precipitation moments in the preset time period, and the precipitation trend in the preset time period is determined according to the timeliness and precipitation intensity corresponding to the at least one critical precipitation moment. In the aspect of the present disclosure, the descriptive information of the precipitation trend in the preset time period may be determined according to the critical precipitation moment playing the critical role in the descriptive information of the precipitation trend, and compared with a method for describing various precipitation trends one by one by adopting an exhaustion method in the related technology, a determination strategy for the descriptive information of the precipitation trend tends to be formulaic, and extensibility is enhanced.

It is noted that the various modules, sub-modules, units, and components in the present disclosure can be implemented using any suitable technology. For example, a module may be implemented using circuitry, such as an integrated circuit (IC). As another example, a module may be implemented as a processing circuit executing software instructions.

Other aspects of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A computer-implemented method tier determining descriptive information of a precipitation trend, using a weather forecasting application installed on a terminal or a server, comprising:

acquiring, by the terminal or the sever, precipitation data in a preset time period;

acquiring, by the terminal or the sever, precipitation intensities at a plurality of precipitation moments in the preset time period from the precipitation data, the plurality of precipitation moments being obtained by dividing the preset time period according to a preset strategy;

selecting, by the terminal or the sever, at least one critical precipitation moment from the plurality of precipitation moments based on the precipitation intensities at the plurality of precipitation moments, the at least one critical precipitation moment referring to a precipitation moment playing a critical role in the descriptive information of the precipitation trend in the preset time period;

determining, by the terminal or the sever, timeliness corresponding to the at least one critical precipitation moment; and determining, by the terminal or the sever, the descriptive information of the precipitation trend in the preset time period based on the timeliness and a precipitation intensity corresponding to the at least one critical precipitation moment, wherein selecting, by the terminal or the sever, the at least one critical precipitation moment from the plurality of precipitation moments based on the precipitation intensities at the plurality of precipitation moments comprises:

determining, by the terminal or the sever, a number of precipitation waves in the preset time period based on the precipitation intensities at the plurality of precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;

when the number of the precipitation waves is 1, determining, by the terminal or the sever, at least one turning-up moment and at least one turning-down moment in the plurality of precipitation moments based on the precipitation intensities at the plurality of precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and determining by the terminal or the sever, the at least one critical precipitation moment based on the starting moment and the ending moment of the precipitation wave, the at least one turning-up moment, and the at least one taming-down moment; and displaying to a user, by the terminal or the server, the precipitation data including the at least one critical precipitation moment, the at least one turning-up moment, and the at least one turning-down moment and the corresponding precipitation intensities;

providing travel guidance to travelers based on the precipitation data including the at least one critical precipitation moment, the at least one turning-up moment, and the at least one turning-down moment and the corresponding precipitation intensities, so as to greatly influence travel and bring convenience to travel of users in the preset time period.

2. The computer-implemented method of claim 1, wherein determining the at least one critical precipitation moment based on the starting moment and the ending moment of the precipitation wave, the at least one turning-up moment, and the at least one turning-down moment comprises:

determining a critical turning-up moment in the at least one turning-up moment;

determining a critical turning-down moment in the at least one turning-down moment;

when a precipitation intensity at a next precipitation moment adjacent to the critical turning-up moment is higher than a precipitation intensity at the starting moment the preset time period and precipitation intensity levels of precipitation intensities in a preset continuous time duration after the critical turning-up moment do not change, determining the starting moment and the ending moment of the precipitation wave, the critical turning-up moment, the next precipitation moment adjacent to the critical turning-up moment, the critical turning-down moment, and a next precipitation moment adjacent to the critical turning-down moment to be the at least one critical precipitation moment;

when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, determining the starting moment and the ending moment of the precipitation wave, the critical turning-down moment, and the next precipitation moment adjacent to the critical turning-down moment to be the at least one critical precipitation moment.

3. The computer-implemented method of claim 2, wherein determining the critical turning-up moment in the at least one turning-up moment comprises:

when there are turning-up moments of which the precipitation intensities are at different precipitation intensity levels in the at least one turning-up moment, determining a turning-up moment with the maximum precipitation intensity in the at least one turning-up moment to be the critical turning-up moment; and When the precipitation intensity at the at least one turning-up moment is at a same precipitation intensity level, determining an earliest turning-up moment to be the critical turning-up moment.

4. The computer-implemented method of claim 2, wherein determining the critical turning-down moment in the at least one turning-down moment comprises:

when there are turning-down moments of which the precipitation intensities are at different precipitation intensity levels in the at least one turning-down moment, determining a turning-down moment with the minimum precipitation intensity in the at least one turning-down moment to be the critical turning-down moment; and when the precipitation intensity at the at least one turning-down moment is at a same precipitation intensity level, determining a turning-down moment closest to the ending moment of the preset time period to be the critical turning-down moment.

5. The computer-implemented method of claim 1, further comprising:

after determining the number of the precipitation waves in the preset time period based on the precipitation data, when the number of the precipitation waves is 2, selecting, from the plurality of precipitation moments, a starting moment and an ending moment of a first precipitation wave and a starting moment of a second precipitation wave in the preset time period; and determining the starting moment and the ending moment of the first precipitation wave and the starting moment of the second precipitation wave to be the at least one critical precipitation moment.

6. The computer-implemented method of claim 1, wherein determining the descriptive information of the precipitation trend in the preset time period based on the timeliness and the precipitation intensity corresponding to the at least one critical precipitation moment comprises:

determining a description manner corresponding to each critical precipitation moment of the at least one critical precipitation moment; and generating the descriptive information of the precipitation trend in the preset time period in the description manner corresponding to each critical precipitation moment according to a chronological order the at least one critical precipitation moment based on the timeliness and precipitation intensity corresponding to the at least one critical precipitation moment.

7. The computer-implemented method of claim 2, further comprising:

after determining the descriptive information of the precipitation trend in the preset time period based on the timeliness and the precipitation intensity corresponding to the at least one critical precipitation moment, determining travel prompting information corresponding to the precipitation trend in the preset time period based on timeliness and precipitation intensities corresponding to the plurality of precipitation moments.

8. A device for determining descriptive information of a precipitation trend, using a weather forecasting application installed on a terminal or a server, comprising:
a processor; and
a memory configured to store instructions executable by the processor,
wherein the processor is configured to:
acquire precipitation data in a preset time period;
acquire precipitation intensities at a plurality of precipitation moments in the preset time period from the precipitation data, the plurality of precipitation moments being obtained by dividing the preset time period according to a preset strategy;
select at least one critical precipitation moment from the plurality of precipitation moments based on the precipitation intensities at the plurality of precipitation moments; the at least one critical precipitation moment referring to a precipitation moment playing a critical role in the descriptive information of the precipitation trend in the preset time period;
determine timeliness corresponding to the at least one critical precipitation moment; and
determine the descriptive information of the precipitation trend in the preset time period based on the timeliness and a precipitation intensity corresponding to the at least one critical precipitation moment,
wherein in order to select the at least one critical precipitation moment from the plurality of precipitation moments based on the precipitation intensities at the plurality of precipitation moments, the processor is further configured to:
determine a number of precipitation waves in the preset time period based on the precipitation intensities at the plurality of precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;
when the number of the precipitation waves is 1, determine at least one turning-up moment and at least one turning-down moment in the plurality of precipitation moments based on the precipitation intensities at the plurality of precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and
determine the at least ne critical precipitation moment based on the starting moment and the ending moment of the precipitation wave, the at least one turning-up moment, and the at least one turning-down moment; and
display to a user, by the terminal or the server, the precipitation data including the at least one critical precipitation moment, the at least one turning-up moment, and the at least one turning-down moment and the corresponding precipitation intensities;
providing travel guidance to travelers based on the precipitation data including the at least one critical precipitation moment, the at least one turning-up moment, and the at least one turning-down moment and the corresponding precipitation intensities, so as to greatly influence travel and bring convenience to travel of users in the preset time period.

9. The device of claim 8, wherein in order to determine the at least one critical precipitation moment based on the starting moment and the ending moment of the precipitation wave, the at least one turning-up moment, and the at least one turning-down moment, the processor is further configured to:
determine a critical turning-up moment in the at least one turning-up moment;
determine a critical turning-down moment in the at least one turning-down moment;
When a precipitation intensity at a next precipitation moment adjacent to the critical turning-up moment is higher than a precipitation intensity at the starting moment of the preset time period and precipitation intensity levels of precipitation intensities in a preset continuous time duration after the critical turning-up moment do not change, determine; the starting moment and the ending moment of the precipitation wave, the critical turning-up moment, the next precipitation moment adjacent to the critical turning-up moment, the critical turning-down moment, and a next precipitation moment adjacent to the critical turning-down moment, to be the at least one critical precipitation moment;
when the precipitation intensity text precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, determine, the starting moment and the ending moment of the precipitation wave, the critical turning-down moment, and the next precipitation moment adjacent to the critical turning-down moment, to be the at least one critical precipitation moment.

10. The device of claim 9, wherein in order to determine the critical turning-up moment in the at least one turning-up moment, the processor is further configured to:
when there are turning-up moments of which the precipitation intensities are at different precipitation intensity levels in the at least one turning-up moment, determine a turning-up moment with the maximum precipitation intensity in the at least one turning-up moment to be the critical turning-up moment; and
when the precipitation intensity at the at least one turning-up moment is at a same precipitation intensity level, determine an earliest turning-up moment to be the critical turning-up moment.

11. The device of claim 9, wherein in order to determine the critical turning-down moment in the at least one turning-down moment, the processor is further configured to:
when there are turning-down moments of which the precipitation intensities are at different precipitation intensity levels in the at least one turning-down moment, determine a turning-down moment with the minimum precipitation intensity in the at least one turning-down moment to be the critical turning-down moment; and when the precipitation intensity at the at least one turning-down moment s at a same precipitation intensity level, determine a turning-down moment closest to the ending moment of the preset time period to be the critical turning-down moment.

12. The device of claim 8, wherein the processor is further configured to:
after determining the number of the precipitation waves in the preset time period based on the precipitation data, when the number of the precipitation waves is 2, select, from the plurality of precipitation moments, a starting moment and an ending moment of a first precipitation wave and a starting moment of a second precipitation wave in the preset time period; and
determine the starting moment and the ending moment of the first precipitation wave and the starting moment of the second precipitation wave to be the at least one critical precipitation moment.

13. The device of claim 8, wherein in order to determine the descriptive information of the precipitation trend in the preset time period based on the timeliness and the precipitation intensity corresponding to the at least one critical precipitation moment, the processor is further configured to:
determine a description manner corresponding to each critical precipitation moment of the at least one critical precipitation moment; and
generate the descriptive information of the precipitation trend in the preset time period in the description manner corresponding to each critical precipitation moment according to a chronological order the at least one critical precipitation moment based on the timeliness and precipitation intensity corresponding to the at least one critical precipitation moment.

14. The device of claim 8, wherein the processor is further configured to:
after determining the descriptive information of the precipitation trend in the preset time period based on the timeliness and precipitation intensity corresponding to the at least one critical precipitation moment, determine travel prompting information corresponding to the precipitation trend in the preset time period based on timeliness and precipitation intensities corresponding to the plurality of precipitation moments.

15. A non-transitory computer-readable storage medium having stored therein instructions that, when executed by one or more processors of a computing device, cause the computing device to perform a computer-implemented method for determining descriptive information of a precipitation trend, using a weather forecasting application installed on the computing device, the method comprising:
acquiring precipitation data in a preset time period;
acquiring precipitation intensities at a plurality of precipitation moments in the preset time period from the precipitation data, the plurality of precipitation moments being obtained by dividing the preset time period according to a preset strategy;
selecting at least one critical precipitation moment from the plurality of precipitation moments based on the precipitation intensities at the plurality of precipitation moments, the at least one critical precipitation moment referring to a precipitation moment playing a critical role in descriptive information of a precipitation trend in the preset time period;
determining timeliness corresponding to the at least one critical precipitation moment; and
determining the descriptive information of the precipitation trend in the preset time period based on the timeliness and a precipitation intensity corresponding to the at least one critical precipitation moment,
wherein selecting the at least one critical precipitation moment from the plurality of precipitation moments based on the precipitation intensities at the plurality of precipitation moments comprises:
determining a number of precipitation waves in the preset time period based on the precipitation intensities at the plurality of precipitation moments, precipitation intensities between starting moments and ending moments of the precipitation waves being all higher than 0, the starting moments of the precipitation waves having precipitation intensities of 0 or being a starting moment of the preset time period and the ending moments of the precipitation waves having precipitation intensities of 0 or being an ending moment of the preset time period;
when the number of the precipitation waves is 1, determining at least one turning-up moment and at least one turning-down moment in the plurality of precipitation moments based on the precipitation intensities at the plurality of precipitation moments, each turning-up moment referring to a moment at which a turning point of a corresponding precipitation intensity level occurs when the precipitation intensity increases and each turning-down moment referring to a moment at which a turning point of a corresponding precipitation intensity level occurs when the precipitation intensity decreases; and
determining the at least one critical precipitation moment based on the starting moment and the ending moment of the precipitation wave, the at least one turning-up moment, and the at least one turning-down moment; and
displaying to a user, by the computing device, the precipitation data including the at least one critical precipitation moment, the at least one turning-up moment, and the at least one turning-down moment and the corresponding precipitation intensities;
providing travel guidance to travelers based on the precipitation data including the at least one critical precipitation moment, the at least one turning-up moment, and the at least one turning-down moment and the corresponding precipitation intensities, so as to greatly influence travel and bring convenience to travel of users in the preset time period.

16. The non-transitory computer-readable storage medium of claim 15, wherein determining the at least one critical precipitation moment based on the starting moment and the ending moment of the precipitation wave, the at least one turning-up moment, and the at least one turning-down moment comprises:
determining a critical turning-up moment in the at least one turning-up moment;
determining a critical turning-down moment in the at least one turning-down moment;
when a precipitation intensity at a next precipitation moment adjacent to the critical turning-up moment is higher than a precipitation intensity at the starting moment of the preset time period and precipitation intensity levels of precipitation intensities in a preset continuous time duration after the critical turning-up moment do not change, determining, the starting moment and the ending moment of the precipitation wave, the critical turning-up moment, the next precipitation moment adjacent to the critical turning-up moment, the critical turning-down moment and, a next precipitation moment adjacent to the critical turning-down moment, to be the at least one critical precipitation moment;

when the precipitation intensity at the next precipitation moment adjacent to the critical turning-up moment is lower than or equal to the precipitation intensity at the starting moment of the preset time period or the precipitation intensity levels of the precipitation intensities in the preset continuous time duration after the critical turning-up moment change, determining, the starting moment and the ending moment of the precipitation wave, the critical turning-down moment, and the next precipitation moment adjacent to the critical turning-down moment, to be the at least one critical precipitation moment.

17. The non-transitory computer-readable storage medium of claim 16, wherein determining the critical turning-up moment in the at least one turning-up moment comprises:

when there are turning-up moments of which the precipitation intensities are at different precipitation intensity levels in the at least one turning-up moment, determining a turning-up moment with the maximum precipitation intensity in the at least one turning-up moment to be the critical turning-up moment; and when the precipitation intensity at the at least one turning-up moment is at a same precipitation intensity level, determining an earliest turning-up moment to be the critical turning-up moment.

18. The non-transitory computer-readable storage medium of claim 16, wherein determining the critical turning-down moment in the at least one turning-down moment comprises:

when there are turning-down moments of which the precipitation intensities are at different precipitation intensity levels in the at least one turning-down moment, determining a turning-down moment with the minimum precipitation intensity in the at least one turning-down moment to be the critical turning-down moment; and when the precipitation intensity at the at least one turning-down moment is at a same precipitation intensity level, determining a turning-down moment closest to the ending moment of the preset time period to be the critical turning-down moment.

19. The non-transitory computer-readable storage medium of claim 15, wherein the method further comprises:

after determining the number of the precipitation waves in the preset time period based on the precipitation data, when the number of the precipitation waves is 2, selecting, from the plurality of precipitation moments, a starting moment and an ending moment of a first precipitation wave and a starting moment of a second precipitation wave in the preset time period; and determining the starting moment and the ending moment of the first precipitation wave and the starting moment of the second precipitation wave to be the at least one critical precipitation moment.

20. The non-transitory computer-readable storage medium of claim 15, wherein determining the descriptive information of the precipitation trend in the preset time period based on the timeliness and the precipitation intensity corresponding to the at least one critical precipitation moment comprises:

determining a description manner corresponding to each critical precipitation moment of the at least one critical precipitation moment; and generating the descriptive information of the precipitation trend in the preset time period in the description manner corresponding to each critical precipitation moment according to a chronological order the at least one critical precipitation moment based on the timeliness and precipitation intensity corresponding to the at least one critical precipitation moment.

\* \* \* \* \*